United States Patent
Nunokawa

[11] Patent Number: 6,084,795
[45] Date of Patent: Jul. 4, 2000

[54] FERROELECTRIC MEMORY DEVICE

[75] Inventor: Hideo Nunokawa, Kawasaki, Japan

[73] Assignee: Fujitsu Limited, Kawasaki, Japan

[21] Appl. No.: 09/310,922

[22] Filed: May 13, 1999

[30] Foreign Application Priority Data

Nov. 11, 1998 [JP] Japan ................................. 10-320575

[51] Int. Cl.⁷ .................................................. G11C 11/22
[52] U.S. Cl. .......................... 365/145; 365/149; 365/168; 365/185.03
[58] Field of Search .................... 365/145, 149, 365/168, 185.03, 185.08

[56] References Cited

U.S. PATENT DOCUMENTS 5,487,030  1/1996  Drab et al. ................................ 365/145
5,999,438  12/1999  Ohsawa .................................... 365/145

Primary Examiner—Tan T. Nguyen
Attorney, Agent, or Firm—Arent Fox Kintner Plotkin & Kahn PLLC

[57] ABSTRACT

A ferroelectric memory comprises a DA converter for receiving any one of 3 digital values as write data and for applying a write analog voltage corresponding to the input digital value to a electrode of a ferroelectric capacitor in order to cause the residual dielectric polarization in the ferroelectric capacitor, and an AD conversion circuit for receiving a read analog voltage obtained in accordance with the residual dielectric polarization value of the ferroelectric capacitor and for restoring the read analog voltage to the original digital value. In the ferroelectric capacitor, residual dielectric polarization corresponding to the write analog voltage occurs. The value of the residual dielectric polarization can be set to a plurality of values corresponding to the write analog voltage. Therefore, among 3 or more values of the write data, a predetermined value is stored in the ferroelectric capacitor. The AD conversion circuit receives the residual dielectric polarization value of the ferroelectric capacitor as a read analog voltage, and by restoring the read analog voltage to the original digital value, the written data can be read. Therefore, data of 3 or more values can be stored in one ferroelectric capacitor, and the stored data can be read properly.

11 Claims, 16 Drawing Sheets

Prior Art

Prior Art

Prior Art

FERROELECTRIC MEMORY DEVICE

BACKGROUND OF THE INVENTION

1. Field of the Invention

The present invention relates to a ferroelectric memory device comprising ferroelectric capacitors, and more specifically to a ferroelectric memory device which stores data of 3 or more values in one ferroelectric capacitor therein.

2. Description of the Related Art

Semiconductor memory devices are generally classified into volatile semiconductor memory devices such as DRAM (Dynamic Random Access Memory) which needs electric power to retain data written therein, and non-volatile semiconductor memory devices such as flash memories and EEPROM (Electric Erasable Programmable Read Only Memory) which do not need electric power to retain the written data. The performance of a semiconductor memory device is often expressed by a storage capacity, an access speed, and power consumption thereof.

As large-capacity, high-speed semiconductor memory devices, DRAMs are mainly used for the main storage of various kinds of computers. However, since DRAMs are volatile, a refresh operation is necessary in order to retain the written data, which leads to high power consumption.

Flash memories and EEPROMs are mainly used in file systems, memory cards, portable equipments and the like, as non-volatile semiconductor memory devices having large capacities and low power consumptions. However, flash memories and EEPROMs need a substantially long time to write data therein.

Meanwhile, ferroelectric memory devices comprising ferroelectric capacitors in memory cells thereof have been developed recently as semiconductor memory devices having advantages of both DRAMs and flash memories and EEPROMs.

A ferroelectric memory device can store binary data by using residual dielectric polarization which remains even when a voltage applied to a ferroelectric capacitor becomes 0.

FIG. 1 shows a configuration of a memory cell of a ferroelectric memory device of this kind.

In FIG. 1, a memory cell 1 comprises a ferroelectric capacitor 3 and a transistor 5 which is a transfer gate. The transistor 5 is formed by an NMOS (N-channel Metal Oxide Semiconductor).

A plate line PL is connected to a electrode 3a of the ferroelectric capacitor 3 for applying a voltage thereto. One transfer electrode 5a of the transistor 5 is connected to the other electrode 3b of the ferroelectric capacitor 3.

A bit line BL which is a transmission line of data is connected to the other transfer electrode 5b of the transistor 5. A word line WL which switches on and off the transistor 5 is connected to a gate electrode 5c of the transistor 5.

FIG. 2 shows a relation (hysteresis loop formed by "a", "b", "c", and "d") between a voltage E applied between the electrodes 3a and 3b of the ferroelectric capacitor 3 and a polarization charge density P thereof. The applied voltage E is a voltage VBL of the bit line BL relative to a reference voltage VPL of the plate line PL (that is, voltage VBL— voltage VPL).

Hereinafter, an operation of writing data in the memory cell 1 will be explained.

When data "1" are written in the memory cell 1 above, the plate line PL is set to 0V and the word line WL is set to high level, as shown in FIG. 3. In this state, the bit line BL is changed from 0V to VCC, then to 0V. 0V is a ground voltage, and VCC is a power supply voltage.

The high level voltage applied to the word line WL is set to a sum of VCC and a voltage higher than a threshold value of the transistor 5, and VCC applied to the bit line BL is transmitted to the electrode 3b of the ferroelectric capacitor 3 with certainty.

As a result, as shown in FIG. 4, a polarization charge of the ferroelectric capacitor 3 changes from "e" to "b", then to "c". Even in the case where the residual dielectric polarization value of the ferroelectric capacitor 3 before the write operation is not "e", the polarization charge always changes from "b" to "c", due to the write operation. As a result, the residual dielectric polarization value of the ferroelectric capacitor 3 after the operation of writing data "1" therein becomes a positive polarization charge value Pr ("c"). This is the state wherein data "1" are stored.

On the other hand, when data "0" are written in the memory cell 1, the plate line PL is set to VCC and the word line WL is set to at high level as shown in FIG. 5, and the bit line BL is changed from VCC to 0V, then from 0V to VCC.

As a result, as shown in FIG. 6, the polarization charge of the ferroelectric capacitor 3 changes from "f" to "a" via "d". Even in the case where the residual dielectric polarization value of the ferroelectric capacitor 3 before the write operation is not "f", the polarization charge always changes from "d" to "a", due to the write operation. As a result, the residual dielectric polarization value of the ferroelectric capacitor 3 after the operation of writing data "0" therein becomes a negative polarization charge value −Pr ("a"). This is the state wherein data "0" are stored.

FIG. 7 shows operation timings of the word line WL and the plate line PL and changes in the voltage of the bit line BL in an operation of reading data written in the memory cell 1. The read operation is performed by changing the voltage of the plate line PL form 0V to VCC then to 0V while the word line WL is at high level. The voltage of the bit line BL is set to 0V before the read operation, and in a floating state when the data are read.

FIG. 8 shows a change in the polarization charge of the ferroelectric capacitor 3 upon the read operation.

When data "1" are written in the memory cell 1, the polarization charge of the ferroelectric capacitor 3 changes from "c" to "d" by the read operation. An electric charge ΔQ1 generated by the change in the polarization charge is distributed in a manner such that the voltages of the bit line BL and the electrode 3b of the ferroelectric capacitor 3 are equalized. As a result, as shown in FIG. 7, the voltage of the bit line BL rises to V1.

On the other hand, when data "0" are written in the memory cell 1, the polarization charge of the ferroelectric capacitor 3 changes from "a" to "d" by the read operation, as shown in FIG. 8. An electric charge ΔQ2 generated by the change in the polarization charge is distributed in a manner such that the voltages of the bit line BL and of the electrode 3b of the ferroelectric capacitor 3 are equalized. As a result, as shown in FIG. 7, the voltage of the bit line BL rises to V0.

The voltage of the bit line BL is then changed from V1 to VCC, or from V0 to 0V by a sense amplifier which is not shown. The data "1" or "0" stored in the memory cell 1 are then read.

After completion of the reading, the polarization charge of the ferroelectric capacitor 3 changes to −Pr ("a") at the time the voltage of the plate line PL becomes 0V. For this reason, if the data written in the ferroelectric capacitor 3 are "1", the stored data are inverted, and rewriting is necessary.

Rewriting of data is performed when the voltage of the bit line BL is amplified by the sense amplifier. Upon the amplification, the voltage of the plate line PL is 0V. In the case where the read data are "1", the voltage of the bit line BL amplified by the sense amplifier becomes VCC, and the polarization charge of the ferroelectric capacitor 3 thus changes to "b", and the data "1" are written therein as in the case shown in FIG. 4.

If the read data are "0", the residual dielectric polarization charge of the ferroelectric capacitor 3 remains at "a" before and after the reading. The memory cell 1 remains in the state of storing data "0" therein.

The read and write operations of binary data "1" and "0" have been explained above. The value of the residual dielectric polarization of the ferroelectric capacitor 3 generally changes in response to the voltage of the bit line BL relative to the reference voltage of the plate line PL upon writing.

Therefore, as shown in FIG. 9, in the case where the residual dielectric polarization value of the ferroelectric capacitor 3 is "a" for example, the value changes to P1 when the bit line voltage (VBL−VPL) becomes V2.

Likewise, when the voltage of the bit line BL (VBL−VPL) becomes V3 in the case where the residual dielectric polarization value of the ferroelectric capacitor 3 is "a", the residual dielectric polarization value of the ferroelectric capacitor 3 becomes P2.

In other words, the state of the residual dielectric polarization of the ferroelectric capacitor 3 changes depending on the voltage applied to the bit line BL. Therefore, storing 3 or more values by using the residual dielectric polarization of the ferroelectric capacitor 3 is being discussed in various aspects.

However, in an attempt of realizing the ferroelectric memory device storing 3 or more values in the ferroelectric capacitor 3, the following problems, which do not occur in the case of storing binary data, occur.

The first problem is caused by the fact that the residual dielectric polarization of the ferroelectric capacitor 3 depends on not only the applied voltage but also the hysteresis.

For example, as shown in FIG. 10, a voltage V3 corresponding to a logical value is applied to the ferroelectric capacitor 3 and the logical value is written in the memory cell 1. After this write operation, the voltage V3 is applied to the ferroelectric capacitor 3 in order to write the logical value therein again.

On this occasion, the polarization charge of the ferroelectric capacitor 3 changes in a sequence of "a", "g", "h", "j" and "k". Therefore, even when the same voltage is applied to the ferroelectric capacitor 3 in order to write the same logical value, the residual dielectric polarization thereof changes to a plurality of values (P3 and P4 in this case). As a result, the written logical value is not restored properly.

The second problem is caused by disagreement between the polarization charge value upon applying a voltage to the bit line BL in a write operation and a residual dielectric polarization value after the write operation.

For example, in the hysteresis loop shown in FIG. 2, the polarization charge upon applying the voltage VCC to the bit line BL in the write operation changes to "b". Meanwhile, the residual dielectric polarization after the write operation changes to "c". Therefore, the residual dielectric polarization value is smaller than the polarization charge.

Consequently, whenever the data are read, the voltage of the bit line BL is smaller than the voltage thereof upon writing the data. Therefore, the data cannot be read properly by a simply comparing of the voltages upon reading and writing.

Furthermore, when data rewriting is necessary, if the voltage upon reading is simply used for the rewriting, a change to a residual dielectric polarization value different from the value before the rewriting is observed. In the case of binary data, the voltage upon reading can be amplified by a sense amplifier and no such problems occur.

The third problem is due to charging of a parasitic capacitor within the memory cell 1 upon writing data.

As shown in FIG. 11, a parasitic capacitor Cp exists between the electrode 3b of the ferroelectric capacitor 3 and the transfer gate 5a of the transistor 5 in the memory cell 1. The parasitic capacitor Cp is charged in response to the voltage applied to the bit line BL upon writing data.

Therefore, as shown in FIG. 12, the residual dielectric polarization immediately after completion of data writing is P5, which is a sum of a natural residual dielectric polarization Pr and the charge of the parasitic capacitor Cp. The electric charge in the parasitic capacitor Cp is discharged gradually with time, causing the residual dielectric polarization value P5 to change to Pr with time.

As a result, following elapsed time after the writing, data to be read changes. In the case of binary data, since data are read by the electric charges ΔQ1 and ΔQ2 shown in FIG. 8, the electric charge in the parasitic capacitor Cp can be treated as an error.

Due to the foregoing descriptions, there have been problems to be solved in order to store data of 3 or more values in the ferroelectric capacitor 3 and to read the stored data properly.

SUMMARY OF THE INVENTION

The present invention has been created in order to solve the above problems, and an object of the present invention is to provide a ferroelectric memory device which can store and read data of any one of 3 or more values in a ferroelectric capacitor therein.

Another object of the present invention is to provide a ferroelectric memory device which can restore data stored in a ferroelectric capacitor therein to the original digital value with certainty.

Still another object of the present invention is to perform comparison of a read analog voltage which is read from a ferroelectric capacitor with a reference read analog voltage with certainty and with great accuracy, when data stored in the ferroelectric capacitor are read.

Yet another object of the present invention is to detect an error in a circuit or the like by outputting error information when data stored in a ferroelectric capacitor are not restored properly.

Still yet another object of the present invention is to maintain a residual dielectric polarization value of a ferroelectric capacitor corresponding to write data by canceling the influence of initial or previous residual dielectric polarization before writing the data in the ferroelectric capacitor.

Another object of the present invention is to read proper data without being affected by an electric charge stored in a parasitic capacitor in a ferroelectric capacitor.

Another object of the present invention is to perform a rewrite operation with certainty after reading data, by using the original digital value restored from a read analog voltage.

A ferroelectric memory device of the present invention comprises a memory cell including a ferroelectric capacitor, a DA converter for receiving any one of 3 or more digital values and applying a write analog voltage corresponding to the input digital value to an electrode of the ferroelectric capacitor to cause residual dielectric polarization to occur in the ferroelectric capacitor, and an AD conversion circuit for receiving a read analog voltage obtained in response to the residual dielectric polarization value of the ferroelectric capacitor and for restoring the read analog voltage to the original digital value.

The DA converter receives a digital value to be written, and applies the write analog voltage corresponding to the input digital value to the electrode of the ferroelectric capacitor. As a result, the residual dielectric polarization corresponding to the write voltage occurs in the ferroelectric capacitor. The value of the residual dielectric polarization can be set to a plurality of values depending on the write analog voltage. Therefore, data of any one of 3 or more values can be stored in the ferroelectric capacitor.

The AD conversion circuit receives the read analog voltage obtained in response to the residual dielectric polarization value of the ferroelectric capacitor and restores the read analog voltage to the original digital value. In other words, the written data (the residual dielectric polarization value) are read by the AD conversion circuit.

In this manner, it becomes possible to store data of 3 or more values in the ferroelectric capacitor and to read the stored data.

According to one of the aspects of the present invention, the AD conversion circuit comprises a plurality of reference memory cells, a DA conversion unit, a comparison unit, and a restore unit.

The DA conversion unit applies a reference write analog voltage having a value different from the write analog voltage which is applied to the memory cell to a electrode of a ferroelectric capacitor in each of the reference memory cells. As a result, residual dielectric polarization occurs in the ferroelectric capacitor corresponding to the reference write analog voltage.

The comparison unit compares each reference read analog voltage obtained in response to the residual dielectric polarization of the ferroelectric capacitor in each of the reference memory cells with a read analog voltage obtained in response to the residual dielectric polarization of the ferroelectric capacitor in the memory cell.

The restore unit restores the original digital value based on the comparison result by the comparison unit.

Therefore, the digital value written by the DA converter can be restored to the original digital value with certainty.

According to another aspect of the present invention, a DA conversion unit sets each reference write analog voltage to an intermediate value between each write analog voltage corresponding to each digital value. Therefore, when the data are read, a difference between the read analog voltage and the reference read analog voltage is large, which leads to easy comparison between both voltages.

According to another aspect of the present invention, the memory cell and the reference memory cells are formed in the same size and shape. Therefore, the characteristics of the memory cell and the reference memory cells are the same. As a result, when data are written, a predetermined residual dielectric polarization value corresponding to a write analog voltage or a reference write analog voltage is set in each of the ferroelectric capacitors of the memory cell and the reference memory cells.

Also, when data are read, the read analog voltage can be compared accurately with each reference read analog voltage.

According to another aspect of the present invention, the capacitance of a bit line connecting a DA converter and a memory cell are the same as the capacitance of each reference bit line connecting a DA conversion unit with each reference memory cell. Therefore, upon data reading, a read analog voltage and a reference read analog voltage both of which properly reflects the residual dielectric polarization value of each ferroelectric capacitor can be obtained and compared accurately.

According to another aspect of the present invention, a restore unit outputs error information when the original digital signal cannot be restored based on a comparison result obtained by a comparison unit, and an error in a circuit due to degradation or failure of a ferroelectric capacitors can be detected.

According to another aspect of the present invention, a polarization initializing circuit sets a residual dielectric polarization value of a ferroelectric capacitor therein to a predetermined value. Therefore, the influence from the initial or previous residual dielectric polarization can be canceled.

According to another aspect of the present invention, a polarization initializing circuit sets a residual dielectric polarization value of a ferroelectric capacitor to a predetermined value before a write operation. Therefore, whenever the same write analog voltage or reference write analog voltage is applied to the ferroelectric capacitor upon a write operation, the residual dielectric polarization has the same value. As a result, the residual dielectric polarization value of the ferroelectric capacitor corresponding to write data is the same.

According to another aspect of the present invention, a discharging circuit discharges an electric charge in a parasitic capacitor of a ferroelectric capacitor. Therefore, the read operation is not affected by the electric charge stored in the parasitic capacitor, and proper data can be read.

According to another aspect of the present invention, a discharging circuit discharges an electric charge in a parasitic capacitor after a write operation or before a read operation. Therefore, the electric charge stored in the parasitic capacitor of a ferroelectric capacitor upon writing data is discharged before a read operation, and only the electric charge corresponding to a residual dielectric polarization of the ferroelectric capacitor can be obtained as a read analog voltage or a reference read analog voltage.

According to another aspect of the present invention, data are rewritten in a memory cell by inputting the restored original digital value into a DA converter. By performing the rewrite of data by using a write analog voltage obtained by inputting the restored original digital value to the DA converter rather than by using a read analog voltage read from a memory cell, a residual dielectric polarization value of a ferroelectric capacitor corresponding to the original digital value is set properly.

BRIEF DESCRIPTION OF THE DRAWINGS

FIG. 11 is a circuit diagram showing a parasitic capacitor in the memory cell shown in FIG. 1; and FIG. 12 shows a state wherein an electric charge in the parasitic capacitor shown in FIG. 11 is added to a natural residual dielectric polarization value.

DESCRIPTION OF THE PREFERRED EMBODIMENTS

Hereinafter, embodiments of the present invention will be explained in detail with reference to the accompanying drawings.

Figure 13:
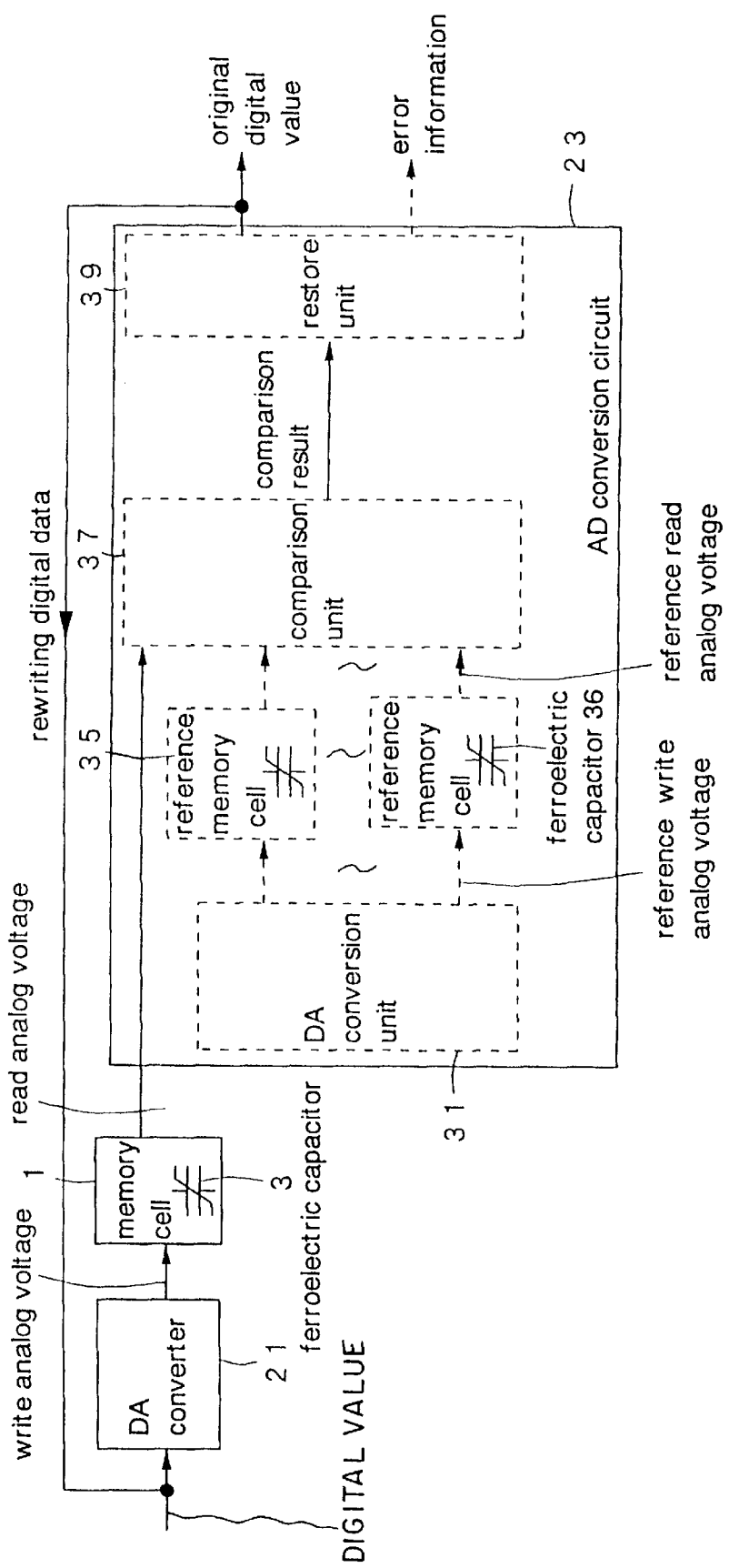
FIG. 13 is a block diagram showing a basic principle of the first embodiment of a ferroelectric memory device of the present invention.

FIG. 13 is a block diagram showing a basic principle of the first and the second embodiments of a ferroelectric memory of the present invention. The ferroelectric memory of the present invention comprises a DA converter, a memory cell 1 including a ferroelectric capacitor 3, and an AD conversion circuit.

The AD conversion circuit comprises a DA conversion unit 31, a plurality of reference memory cells 35 each of which includes a ferroelectric capacitor 36, a comparison unit 37, and a restore unit. The restore unit corresponds to an encoder 39 which will be explained later.

Figure 14:
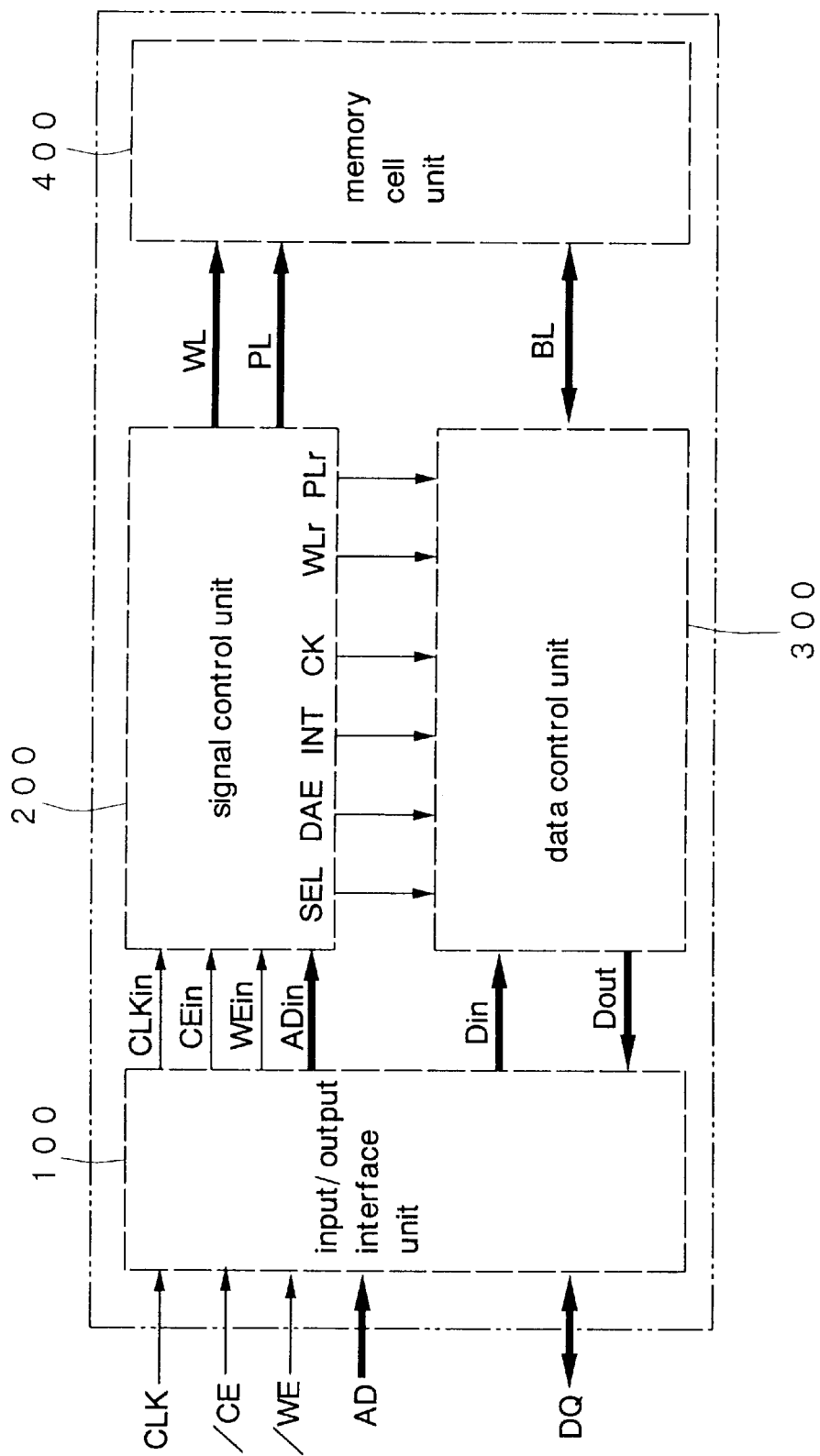
FIG. 14 shows an outline of the first embodiment of the ferroelectric memory device of the present invention.

FIG. 14 shows the first embodiment of the ferroelectric memory device of the present invention. In this embodiment the ferroelectric memory is fabricated as a memory chip.

In FIG. 14, the ferroelectric memory device in this embodiment comprises an input/output interface unit 100 which controls input and output of external signals, a signal control unit 200 which generates various kinds of control signals from input external signals and controls the entire device, a data control unit 300 which controls input data Din and output data Dout, and a memory cell unit 400 which stores data.

A clock signal CLK, a chip enable signal /CE, a write enable signal /WE, address signals AD and data signals DQ are supplied to the input/output interface unit 100. The data signals DQ are input/output signals while the signals other than the data signals DQ are all external input signals. The signals such as the address signals AD and the data signals DQ shown by bold arrows are bus signals using a plurality of lines.

The input/output interface unit 100 receives the clock signal CLK, the chip enable signal /CE, the write enable signal /WE, the address signals AD, and the data signals DQ by an input buffer which is not shown, and outputs an internal clock signal CLKin, an internal chip enable signal CEin, an internal write enable signal WEin, internal address signals ADin to the signal control unit 200. In this specification, the expression of "/" used in /CE and /WE for example means a signal of negative logic, that is, a signal which becomes active when it is at low level.

The input/output interface unit 100 outputs the input data Din which are write data to the data control unit 300, and receives the output data Dout which are read data from the data control unit 300. The input data Din and the output Dout are connected to lines of the data signals DQ by input buffers and output buffers both of which are not shown.

The signal control unit 200 generates, based on signals input from the input/output interface unit 100, a select signal SEL, a DA enable signal DAE, an initializing signal INT, a latch signal CK, a signal of a reference word line WLr, and a signal of a reference plate line PLr, and outputs the generated signals to the data control unit 300.

Using the internal clock signal CLKin, the internal chip enable signal CEin, the internal write enable signal WEin, and the internal address signals ADin, the signal control unit 200 selects a predetermined word line WL and a predetermined plate line PL, and outputs signals of the selected lines to the memory cell unit 400.

Bit lines BL are connected between the data control unit 300 and the memory cell unit 400.

Figure 15:
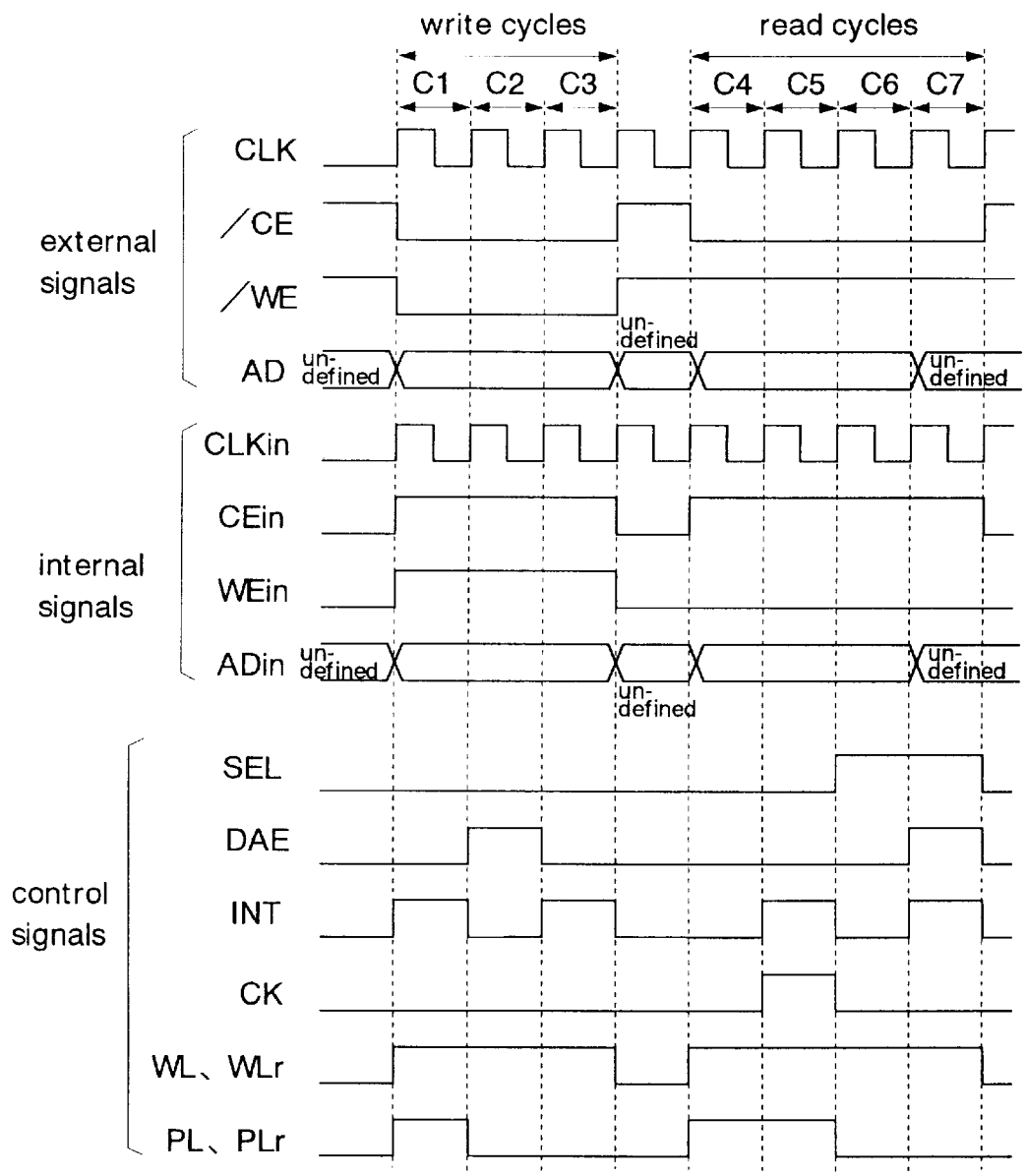
FIG. 15 is a timing chart of external signals, internal signals, and control signals in the first embodiment.

FIG. 15 shows a timing chart of external signals, internal signals, and control signals generated by the signal control unit 200. In this embodiment of the ferroelectric memory device, internal control is performed in synchronization with the clock signal CLK input from the exterior. A write operation is performed in a write cycle composed of 3 clock cycles from the first cycle C1 to the third cycle C3. A read operation is performed in a read cycle composed of 4 clock cycles from the fourth cycle C4 to the seventh cycle C7.

The timing of external signal input is defined as a timing specification, and the external signals are input according to this specification.

The signal control unit 200 comprises a logic circuit which outputs control signals at the timing shown in FIG. 15. Hereinafter, an operation of the signal control unit 200 in each of the clock cycles will be explained.

In the first cycle C1, the signal control unit 200 sets the initializing signal INT, the word line WL, the reference word line WLr, the plate line PL, and the reference plate line PLr at high level, and other signals at low level. In the second cycle C2, the signal control unit 200 sets the DA enable signal DAE, the word line WL, and the reference word line WLr at high level, and other signals low. In the third cycle C3, the control unit 200 sets the initial signal INT, the word line WL, and reference word line WLr at high level and other signals low.

In the fourth cycle C4, the control unit 200 sets the word line WL, the reference word line WLr, the plate line PL, and the reference plate line PLr at high level and other signals low. In a fifth cycle C5, the control unit 200 sets the initializing signal INT, the latch signal CK, the word line WL, the reference word line WLr, the plate line PL, and the reference plate line PLr at high level and the other signals low. In the sixth cycle C6, the control unit 200 sets the select signal SEL, the word line WL, and the reference word line WLr at high level and the other signals low. In the seventh cycle C7, the control unit 200 sets the select signal SEL, the DA enable signal DAE, the initializing signal INT, the word line WL, and the reference word line WLr at high level and the other signals low.

Figure 16:
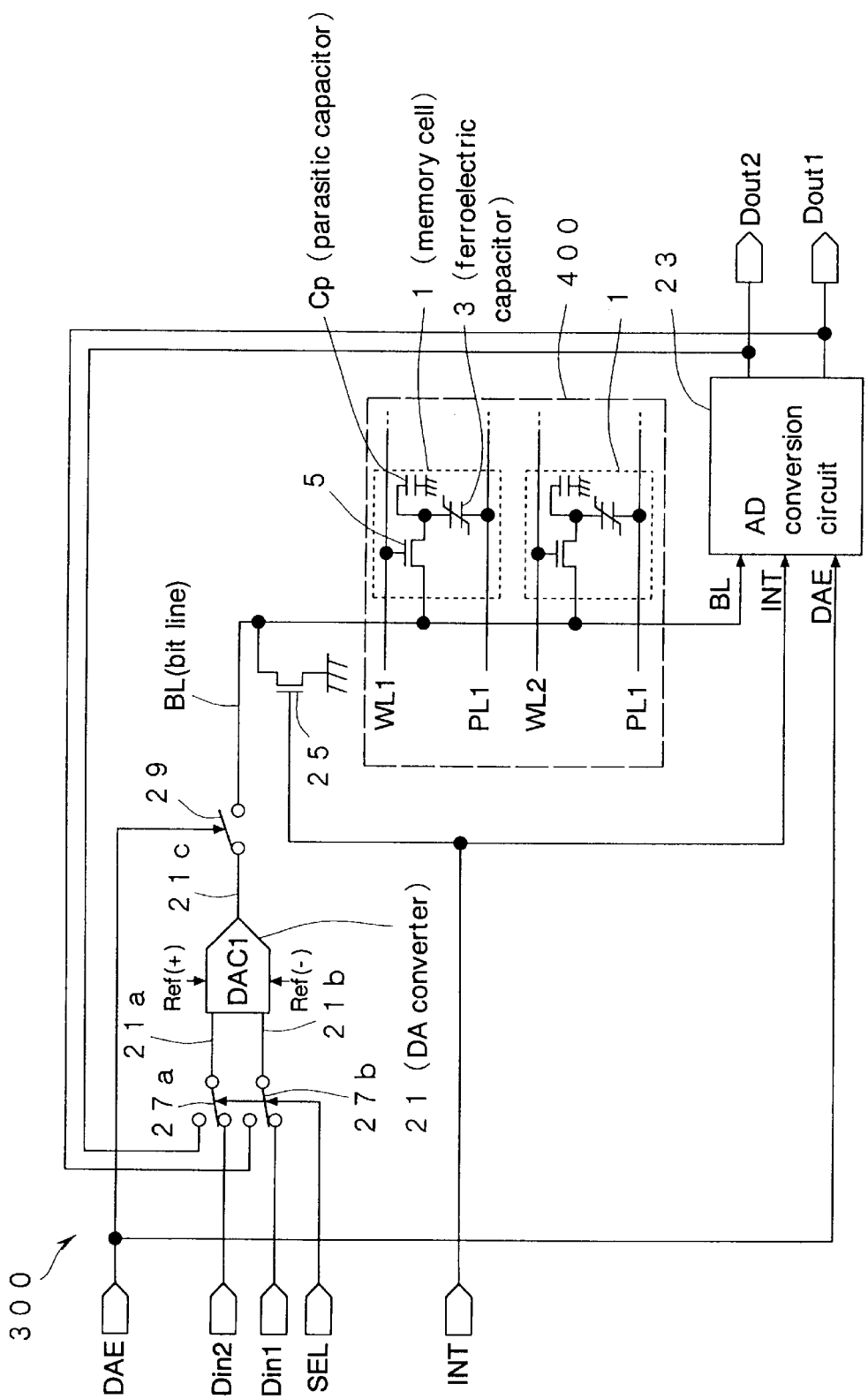
FIG. 16 is a circuit diagram of a data control unit and a memory cell unit shown in FIG. 14.

FIG. 16 shows an outline of the circuit configuration of the data control unit 300 and the memory cell unit 400. The memory cell unit 400 is surrounded by a dashed line. For the sake of convenience in explanation, FIG. 16 shows a minimum configuration to store 4 values by 2-bit input data Din1 and Din2.

In FIG. 16, the data control unit 300 comprises the DA converter 21, the AD conversion circuit 23, an NMOS 25, select switches 27a and 27b, and a control switch 29.

The DA converter 21 includes input terminals 21a and 21b to which 2-bit data can be input, and has a function of outputting a write analog voltage in proportion to any one of 4 digital values input from its input terminals 21a and 21b. The DA converter 21 can change the minimum output voltage and the maximum output voltage by setting its reference terminals Ref(+) and Ref(−) to predetermined values.

The input terminal 21a is connected to the line of either the input data Din2 or output data Dout2 via the select switch 27a. The input terminal 21b is connected to the line of either the input data Din1 or output data Dout1 via the select switch 27b.

The select switches 27a and 27b are switched on and off by the select signal SEL. The select switches 27a and 27b connects the input terminals 21a and 21b with the lines of the input data Din1 and Din2 when the select signal SEL is at low level. The select switches 27a and 27b connects the input terminals 21a and 21b with the lines of the output data Dout1 and Dout2 when the select signal SEL is at high level.

An output terminal 21c of the DA converter 21 is connected to the bit line BL via the control switch 29. The DA enable signal DAE switches on and off the control switch 29. The control switch 29 disconnects the output terminal 21c from the bit line BL when the DA enable signal DAE is at low level, and connects the terminal 21c to the bit line BL when the DA enable signal DAE is at high level.

Each of the select switches 27a and 27b and the control switch 29 is composed of a CMOS switch wherein a source electrode of NMOS and a drain electrode of PMOS are connected and a complementary signal line is connected to each gate electrode of the NMOS and PMOS.

A drain electrode of the NMOS 25 is connected to the bit line BL and the source electrode of the NMOS is set to 0V (ground voltage). The line of the initializing signal INT is connected to the gate electrode of the NMOS 25.

The AD conversion circuit 23 receives the bit line BL, the initializing signal INT, and the DA enable signal DAE, and outputs output data Dout1 and Dout2.

Figure 1:
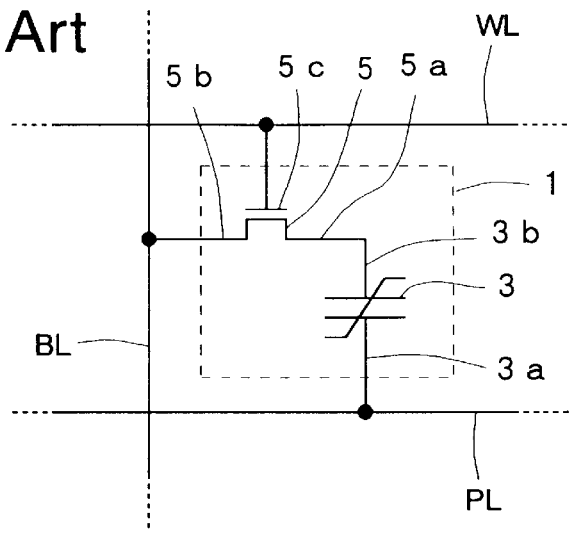
FIG. 1 is a circuit diagram showing a memory cell of a conventional ferroelectric memory device.
Figure 2:
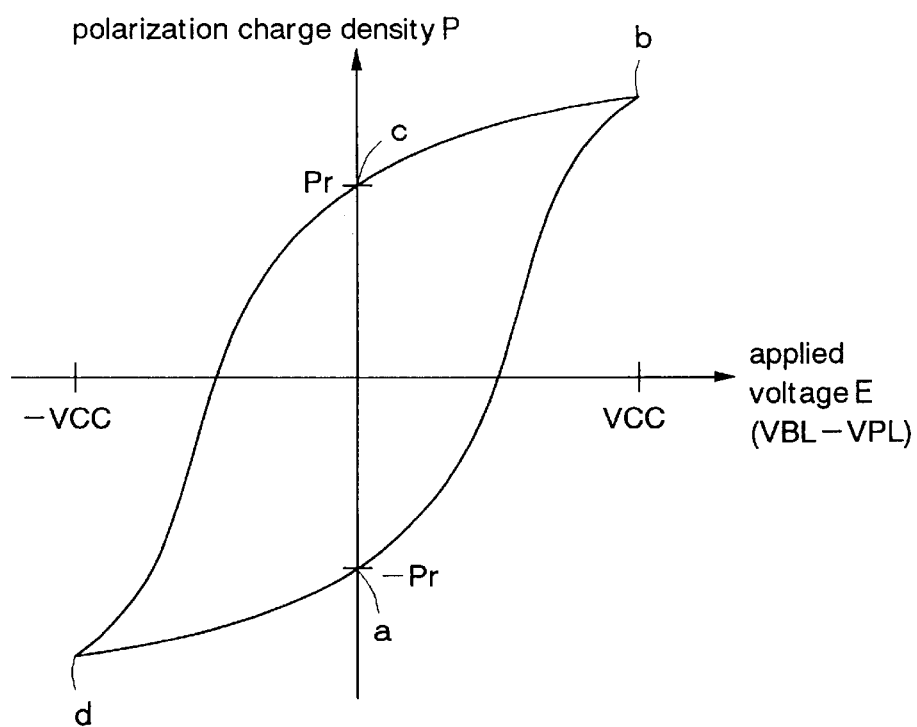
FIG. 2 shows a relation between a voltage applied to a ferroelectric capacitor shown in FIG. 1 and a polarization charge density thereof.
Figure 3:
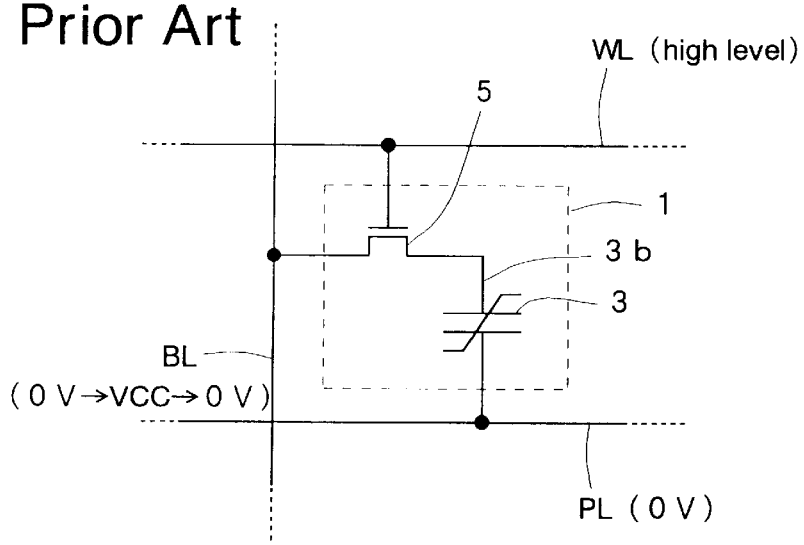
FIG. 3 is a circuit diagram showing a state wherein data "1" are written in the memory cell shown in FIG. 1.
Figure 4:
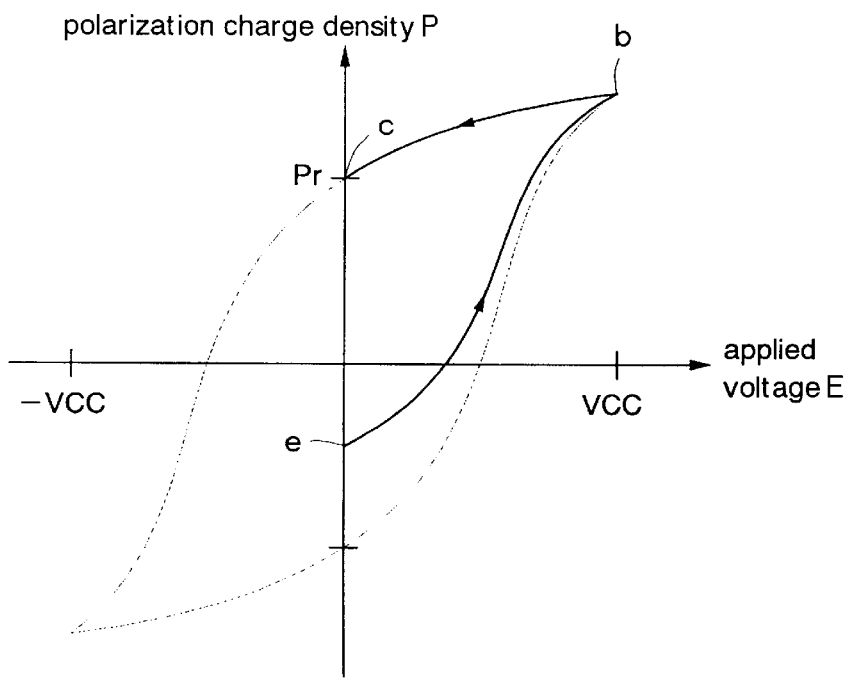
FIG. 4 shows changes in the polarization charge of the ferroelectric capacitor shown in FIG. 3 when data "1" are written in the memory cell.
Figure 5:
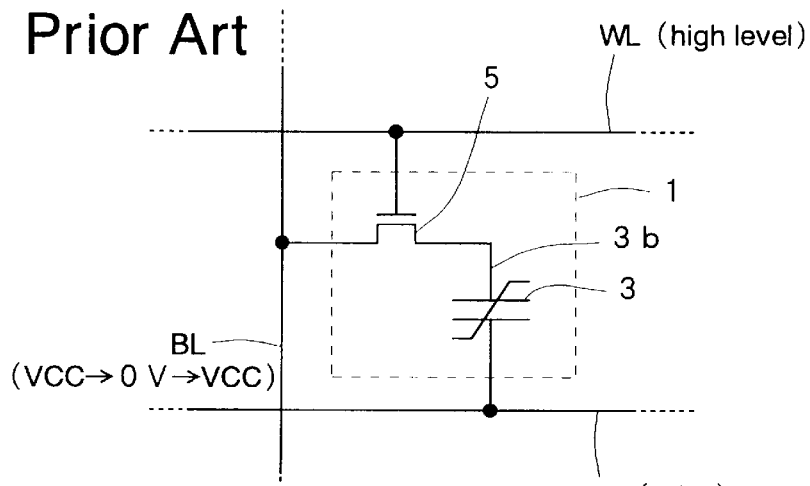
FIG. 5 is a circuit diagram showing a state wherein data "0" are written in the memory cell shown in FIG. 1.
Figure 6:
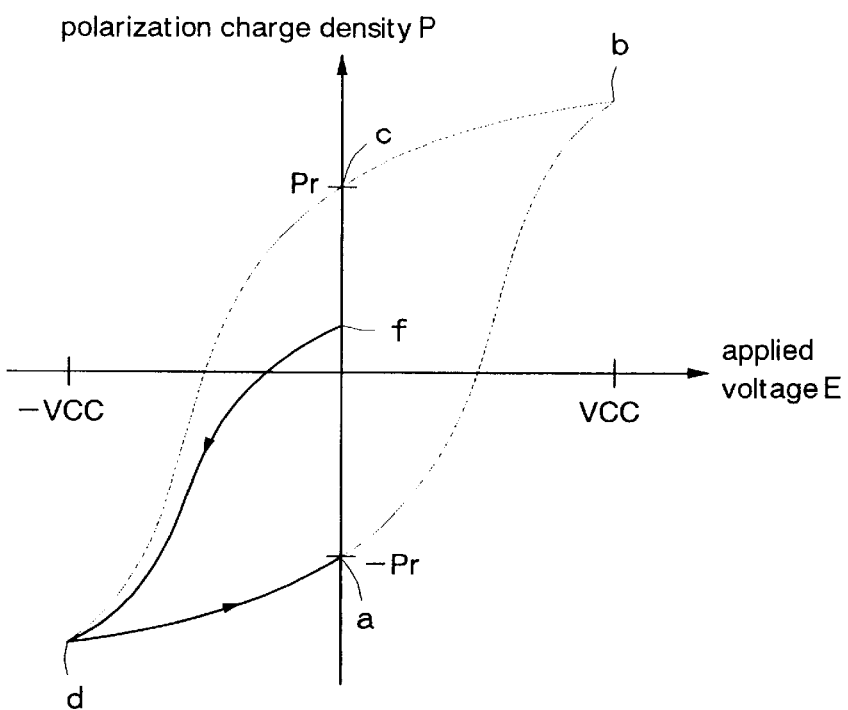
FIG. 6 shows changes in the polarization charge of the ferroelectric capacitor shown in FIG. 5 when data "0" are written in the memory cell.
Figure 7:
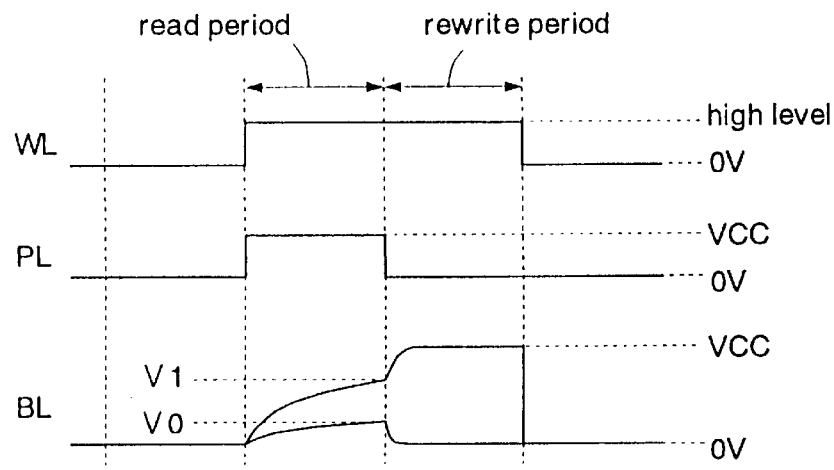
FIG. 7 is a timing chart showing an operation of reading data written in the memory cell shown in FIG. 1.
Figure 8:
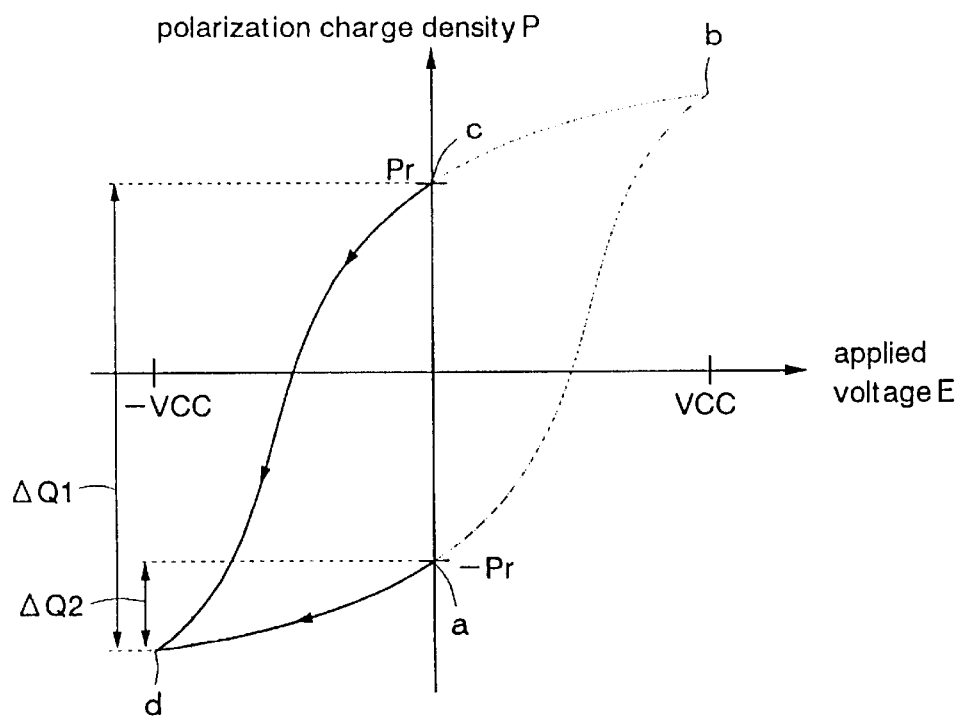
FIG. 8 shows changes in the polarization charge of the ferroelectric capacitor shown in FIG. 7 when data written in the memory cell are read.
Figure 9:
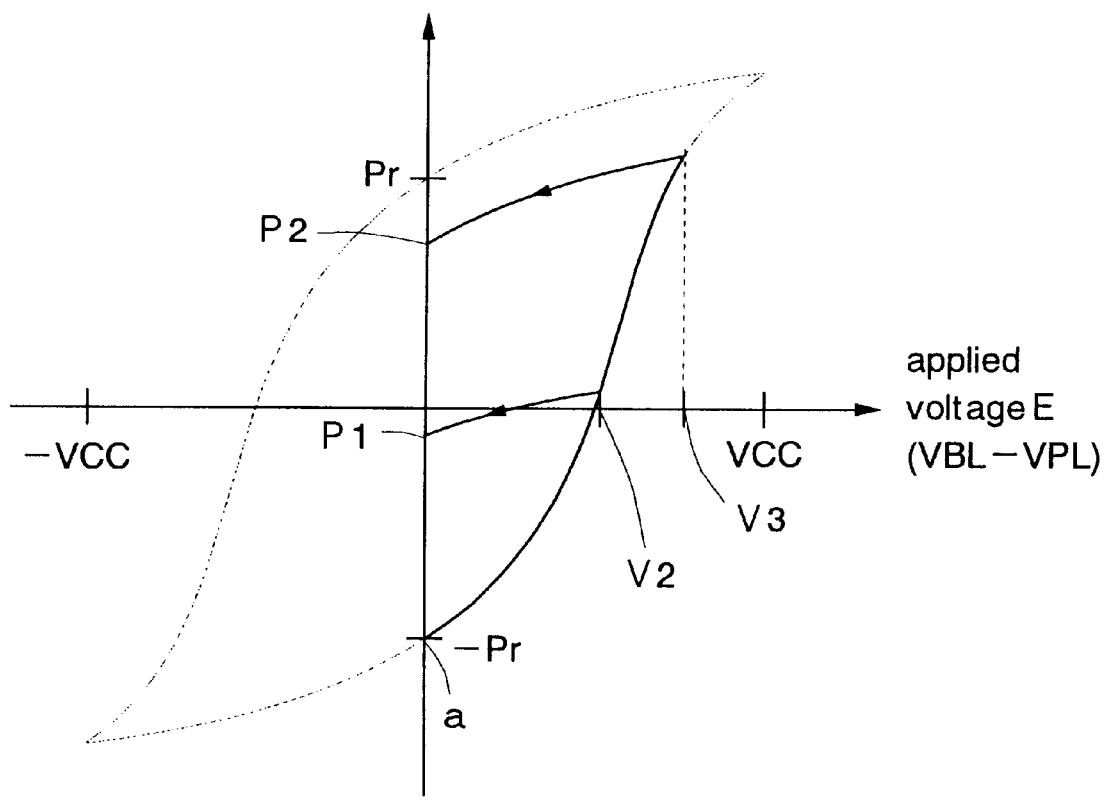
FIG. 9 shows changes in a residual dielectric polarization corresponding to a voltage applied to the ferroelectric capacitor shown in FIG. 1.
Figure 10:
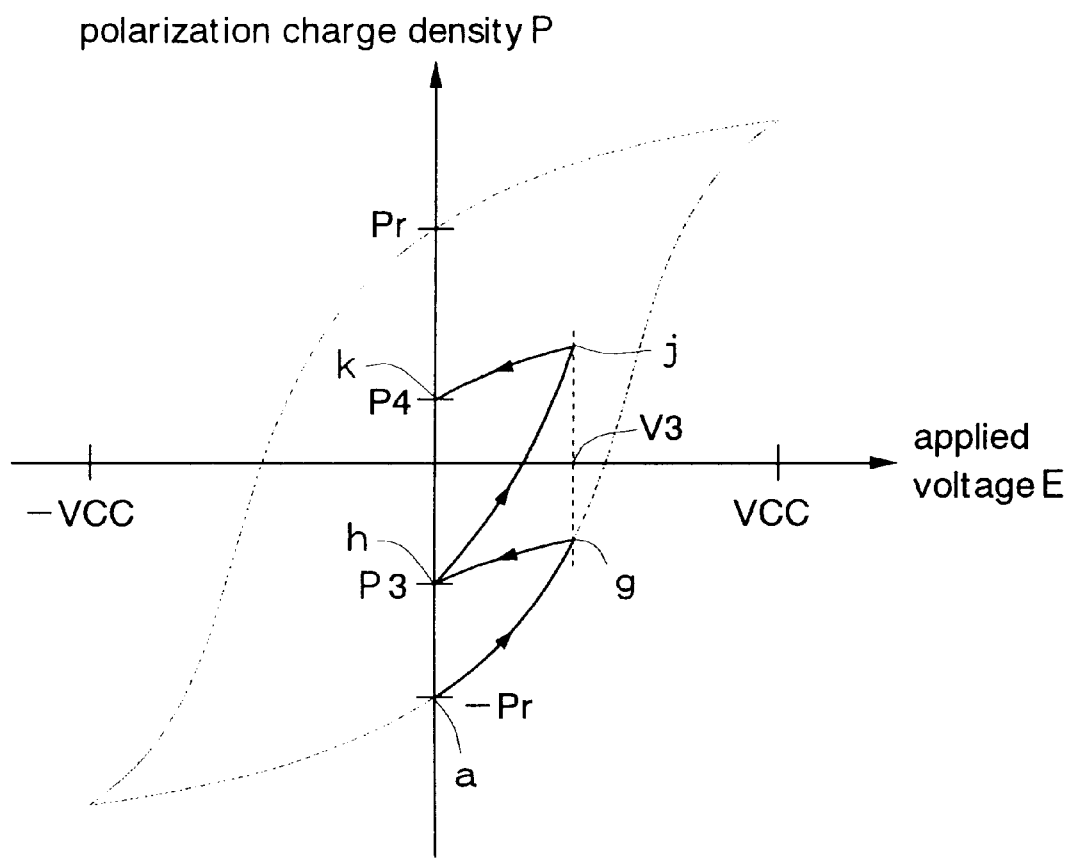
FIG. 10 shows an example of dependency of the residual dielectric polarization of the ferroelectric capacitor shown in FIG. 1 on hysterics.
Figure 1:
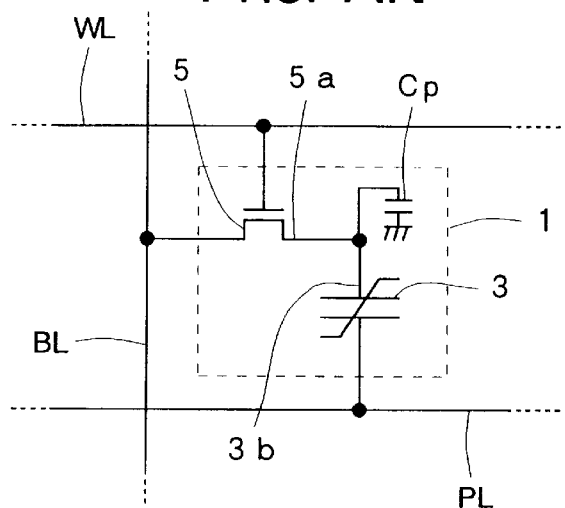
Figure 1:
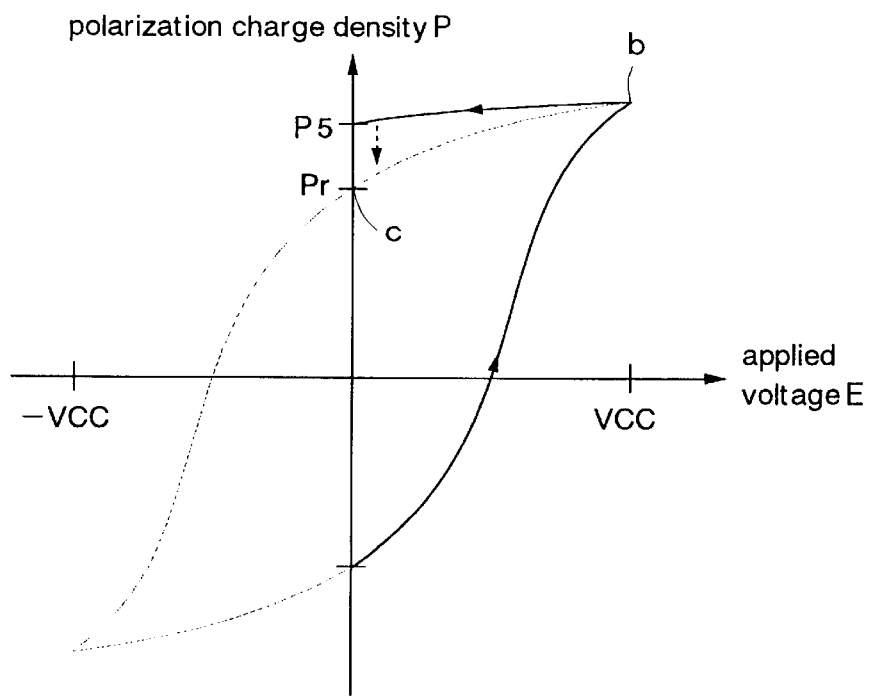

In the memory cell unit 400, a plurality of memory cells 1 are aligned vertically and horizontally. The memory cells 1 have the same configuration as the conventional memory cell 1 shown in FIG. 1. Each of the memory cells 1 includes a ferroelectric capacitor 3 and a transistor 5 composed of an NMOS.

For the sake of convenience in explanation, only two memory cells 1 are shown. A word line WL1, a plate line PL1, and the bit line BL are connected to one of the memory cells 1 and a word line WL2, a plate line PL2, and the bit line are connected to the other memory cell 1. A parasitic capacitor Cp exists between the ferroelectric capacitor 3 and the transistor 5 in each of the memory cells 1.

Figure 17:
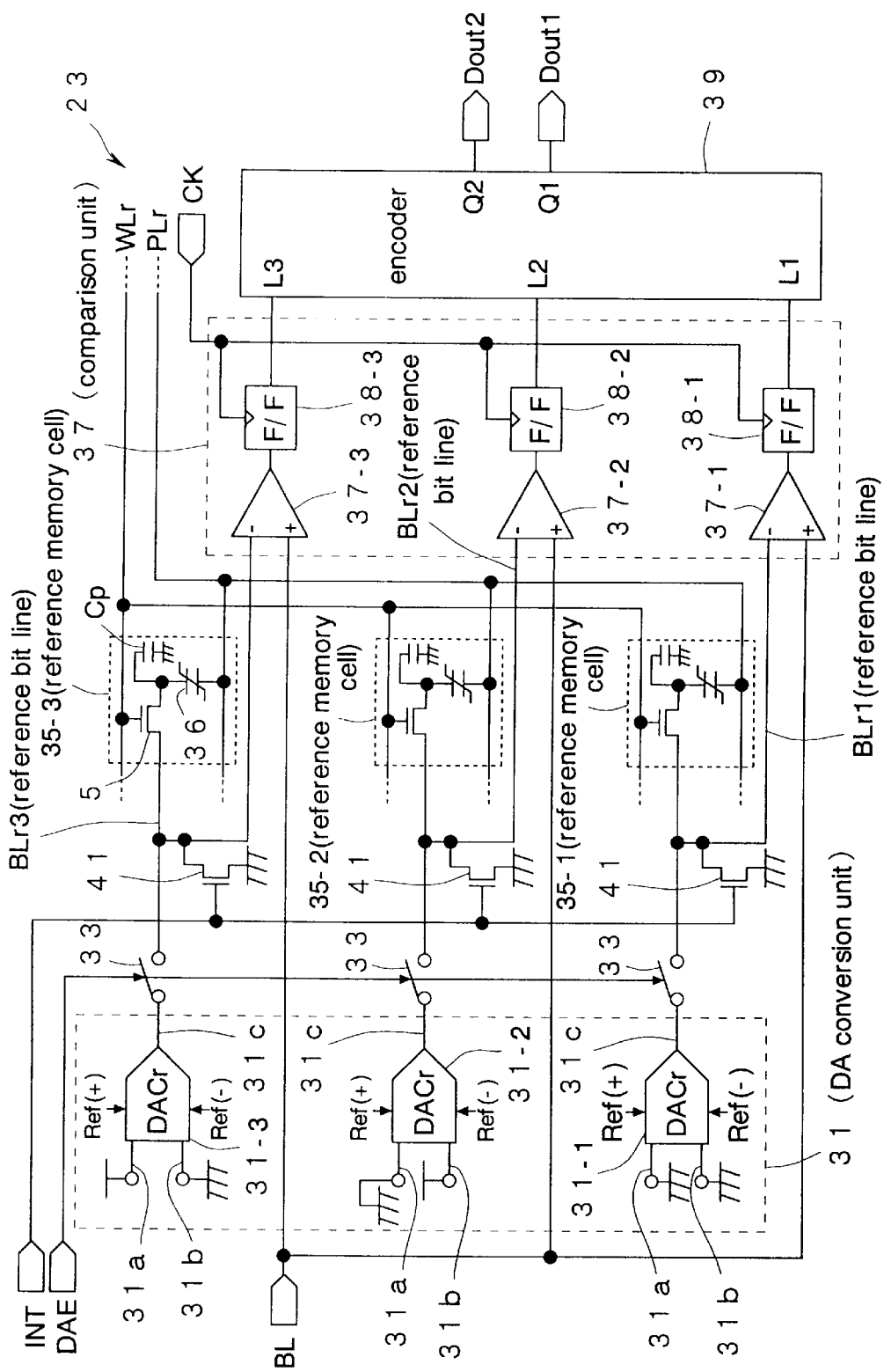
FIG. 17 is a diagram of an AD conversion circuit shown in FIG. 16.

FIG. 17 shows a configuration of the AD conversion circuit 23. The AD conversion circuit 23 comprises a DA conversion unit 31 including 3 DA converters 31-1, 31-2 and 31-3, 3 control switches 33, 3 reference memory cells 35-1, 35-2 and 35-3, a comparison unit 37 including 3 comparators 37-1, 37-2 and 37-3, and 3 flip-flop circuits 38-1, 38-2 and 38-3, an encoder 39, and 3 NMOSs 41. A read operation which will be explained later becomes possible by adopting the number of circuit components (3 in this case) smaller than the input digital value (4 values in this case) by 1, except for the encoder 39.

Each of the DA converters 31-1, 31-2, and 31-3 has input terminals 31a and 31b whereto 2-bit data can be input. The DA converters 31-1, 31-2, and 31-3 have a function of outputting 4 reference write analog voltages in proportion to digital values input from the input terminals 31a and 31b. The DA converters 31-1, 31-2, and 31-3 have ½LSB voltage offset to the DA converter 21 in the data control unit 300. The DA converters 31-1, 31-2, and 31-3 can change maximum and minimum output voltages by setting their reference terminals Ref(+) and Ref(−) to predetermined values.

0V is input to both input terminals 31a and 31b of the DA converter 31-1. 0V and VCC are input to the input terminals 31a and 31b of the DA converter 31-2. VCC and 0V are input to input terminals 31a and 31b of the DA converter 31-3.

Therefore, the output terminal 31c of the DA converter 31-1 outputs a reference write analog voltage corresponding to a digital value "0". The output terminal 31c of the DA converter 31-2 outputs a reference write analog voltage corresponding to a digital value "1", and the output terminal 31c of the DA converter 31-3 outputs a reference write analog voltage corresponding to a digital value "2".

By the ½LSB offset described in the above, each of the reference write analog voltages output from the DA converters 31-1, 31-2, and 31-3 is larger than the write analog voltage output by the DA converter 21 in response to each of the digital values by ½LSB.

As a result, the reference write analog voltage output by the DA converter 31-1 has an intermediate value between write analog voltages output from the DA converter 21 in response to digital values of "0" and "1". The reference write analog voltage output by the DA converter 31-2 has an intermediate value between write analog voltages output from the DA converter 21 in response to digital values of "1" and "2". The reference write analog voltage output by the DA converter 31-3 has an intermediate value between write analog voltages output from the DA converter 21 in response to digital values of "2" and "3".

Each of the output terminals 31c of the DA converters 31-1, 31-2, and 31-3 is connected to reference bit lines BLr1, BLr2 and BLr3 respectively via each of the control switches 33. The control switches 33 are switched on and off by the DA enable signal DAE. The control switches 33 disconnect the output terminals 31c from the reference bit lines BLr1, BLr2, and BLr3 respectively when the DA enable signal DAE is at low level, and connects the output terminals 31c to the reference bit lines when the DA enable signal DAE is at high level.

Each of the control switches 33 is composed of a CMOS switch or the like, as the control switch 29 is of above.

The reference bit lines BLr1, BLr2, and BLr3 are connected to each of the drain gates of NMOSs 41 respectively. Source electrodes of the NMOSs 41 are grounded (that is, set to 0V). Gate electrodes of the NMOSs 41 are connected to the line of the initializing signal INT.

The reference memory cells 35-1, 35-2, and 35-3 have the same size and shape as the memory cell 1 described above. Therefore, a characteristic of the ferroelectric capacitors 36 within the reference memory cells 35-1, 35-2, and 35-3 is the same as that of the ferroelectric capacitor 3 in the memory cell 1. Parasitic capacitors Cp also exist between ferroelectric capacitors 36 and transistors 5 in the reference memory cells 35-1, 35-2, and 35-3, as in the memory cell 1.

The reference bit lines BLr1, BLr2, and BLr3 are connected to the reference memory cells 35-1, 35-2, and 35-3 respectively. The reference word line WLr, the reference plate line PLr are also connected to the reference memory cells 35-1, 35-2, and 35-3. A load capacitance of the reference bit lines BLr1, BLr2, and BLr3 is the same as that of the bit line BL. For example, the wiring length and wiring width of the reference bit lines BLr1, BLr2, and BLr3 are the same as those of the bit line BL in the same wiring layer.

By having the same load capacitance of the reference bit lines BLr1, BLr2, and BLr3 as that of the bit line BL, the voltages of the reference bit lines BLr1, BLr2, and BLr3 can be compared accurately with the voltage of the bit line BL.

Voltages of the reference bit lines BLr1, BLr2, and BLr3 are input to "−" terminals of the comparators 37-1, 37-2, and 37-3 respectively. The bit line BL is connected to "+" terminals of the comparators 37-1, 37-2, and 37-3. Therefore, when the voltage of the bit line BL is higher than the voltage of each of the reference bit lines BLr1, BLr2, and BLr3, each of the comparators 37-1, 37-2, and 37-3 outputs high.

Output terminals of the comparators 37-1, 37-2, and 37-3 are connected to input terminals of the flip-flop circuits 38-1, 38-2, and 38-3 respectively. The latch signal CK is connected to each of clock input terminals of the flip-flop circuits 38-1, 38-2, and 38-3. The flip-flop circuits 38-1, 38-2 and 38-3 obtain the output from the comparators 37-1, 37-2, and 37-3 respectively upon rising of the latch signal CK.

Output terminals of the flip-flop circuits 38-1, 38-2, and 38-3 are connected to input terminals L1, L2, and L3 of the encoder 39 respectively. Output terminals Q1 and Q2 of the encoder 39 are respectively connected to lines of the output data signals Dout1 and Dout2.

The encoder 39 encodes signals input to its input terminals L1, L2, and L3 based on a truth table shown in Table 1. An encoding result is output as the output data signals Dout1 and Dout2. Therefore, a digital value written in the ferroelectric capacitor 3 is restored by the encoder 39.

TABLE 1

| input digital values | input | | | output | |
|---|---|---|---|---|---|
| | L3 | L2 | L1 | Q2(Dout2) | Q1(Dout1) |
| 3 | 1 | 1 | 1 | 1 | 1 |
| 2 | 0 | 1 | 1 | 1 | 0 |
| 1 | 0 | 0 | 1 | 0 | 1 |
| 0 | 0 | 0 | 0 | 0 | 0 |
| — | the other combinations | | | undefined | undefined |

An operation of writing data in the above ferroelectric memory device will be explained next.

Before the write operation, initialization of the residual dielectric polarization of the ferroelectric capacitors 3 and 36 in the memory cell 1 and the reference memory cells 35-1, 35-2, and 35-3 is performed. In initialization of the memory cell 1, the initializing signal INT is at high level and the bit line BL is at 0V. The plate line PL is at the power supply voltage VCC, and the word line WL is high. In initialization of the reference memory cells 35-1, 35-2, and 35-3, the initializing signal INT is at high level and the reference bit lines BLr1, BLr2, and BLr3 are at 0V. The reference plate line PLr is at the power supply voltage VCC, and the reference word line WLr is high.

Figure 18:
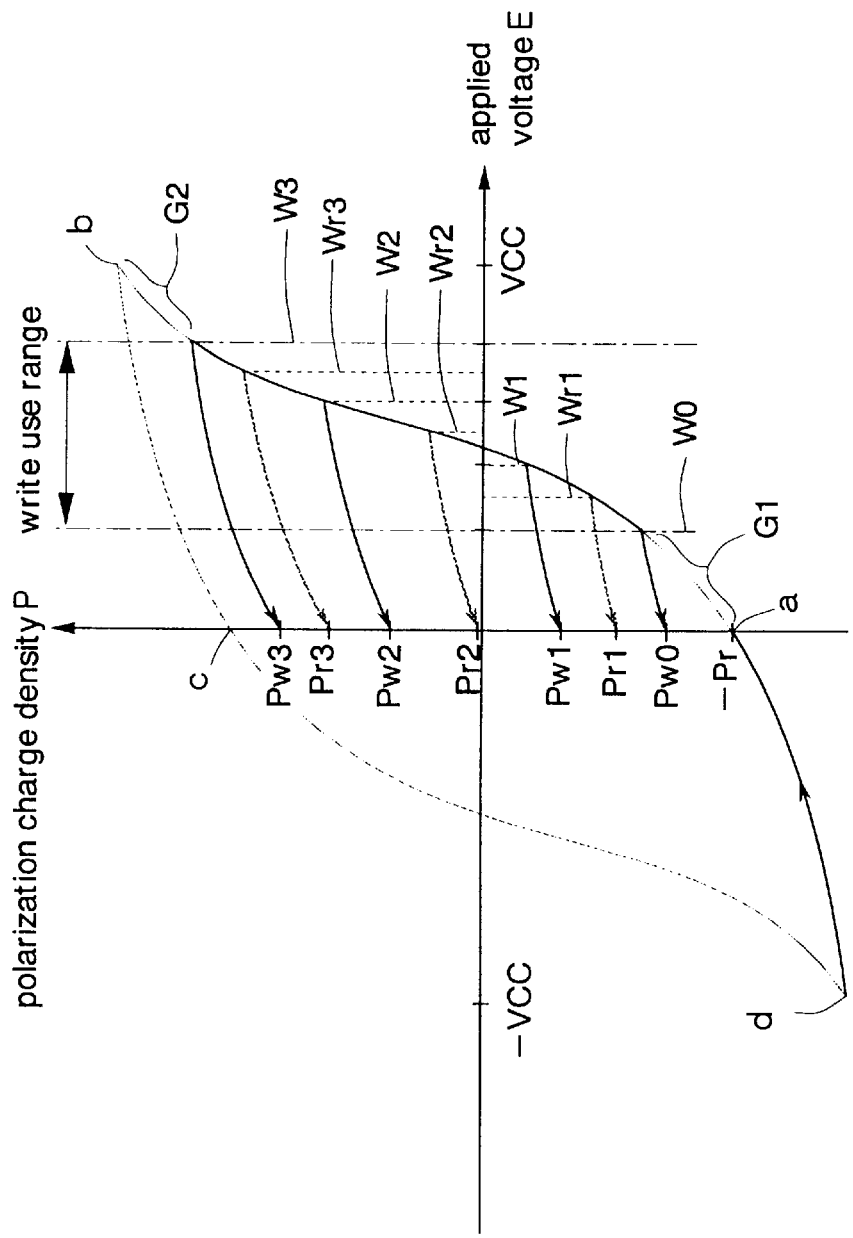
FIG. 18 shows an operation of writing data into a ferroelectric capacitor in the first embodiment.

By the initialization of the residual dielectric polarization, as shown in FIG. 18, the polarization charges of the ferroelectric capacitors 3 and 36 change to "d" and then to "a" upon completion of the initialization. As a result, the residual dielectric polarization value of the ferroelectric capacitors 3 and 36 of the memory cell 1 and the reference memory cells 35-1, 35-2, and 35-3 is always "a" at the start of a write operation, and no effects of initial or previous residual dielectric polarization is observed.

The DA converter 21 receives the input data Din1 and Din2, and outputs to the bit line BL any one of write analog voltages W0, W1, W2, and W3 respectively corresponding to the input digital values "0", "2", and "3". Since the voltage of the plate line PL is always 0, the voltage output to the bit line BL is the voltage to be applied between the both electrodes of the ferroelectric capacitor 3. On this occasion, the DA enable signal DAE and the word line WL are set at high level.

The output terminals 31c of the DA converter 31-1, 31-2, and 31-3 respectively output reference write analog voltages Wr1, Wr2, and Wr3 which are the intermediate voltages between the write analog voltages W0, W1, W2, and W3 output by the DA converter 21, as has been described above.

The reference terminals Ref(+) and Ref(−) of the DA converter 21 and the DA converters 31-1, 31-2, and 31-3 are set to predetermined values, and a maximum output voltage from the DA converters 21 and 31-1, 31-2, and 31-3 is lower than VCC while a minimum output voltage is higher than 0V. In other words, each of the DA converter 21 and the DA converters 31-1, 31-2, and 31-3 outputs a voltage within a write use range in FIG. 18.

By setting the reference terminals Ref(+) and Ref(−) as in the above, portions G1 and G2 in FIG. 18 having moderate slopes of the hysteresis loop with small residual dielectric polarization value differences are not used. Therefore, data comparison upon data reading which will be described later can be performed with certainty.

The high level voltage applied to the word line WL and the reference word line WLr is set to a value which is a sum of VCC and a voltage higher than a threshold voltage of the transistor 5. The voltages applied to the bit line BL and the reference bit lines BLr1, BLr2, and BLr3 are fed to the ferroelectric capacitors 3 and 36 with certainty.

The residual dielectric polarization value of the ferroelectric capacitor 3 in the memory cell 1 becomes any one of Pw0, Pw1, Pw2, and Pw3 corresponding to the digital values "0", "1", "2", and "3" respectively, by the write of the data by the DA converter 21. The residual dielectric polarization value of each of the ferroelectric capacitors 36 in the reference memory cells 35-1, 35-2, and 35-3 becomes Pr1, Pr2, and Pr3 respectively by the writing of the data by the DA converters 31-1, 31-2, and 31-3. The order of the residual dielectric polarization values are Pw3>Pr3>Pw2>Pr2>Pw1>Pr1>Pw0.

In other words, by using the 3 DA converters 31-1, 31-2, and 31-3 and the 3 reference memory cells 35-1, 35-2, and 35-3, the number of which (3 in this case) is smaller than the number of the input digital values (4 values in this case) by 1, the residual dielectric polarization having values Pr1, Pr2, and Pr3 which are intermediate values of the residual dielectric polarization values Pw0, Pw1, Pw2 and Pw3 occurs.

The electric charges in the parasitic capacitors Cp in the memory cell 1 and in the reference memory cells 35-1, 35-2, and 35-3 generated by the write operation are discharged. On this occasion, the initializing signal INT is at high level and the bit line BL is at 0V. The plate line PL is at 0V and the word line is at high level. In this manner, the discharge is performed and the write operation is completed.

An operation of reading data from the ferroelectric memory device will be explained next.

The read operation is performed by causing the plate line PL to become VCC while the word line WL is at high level.

Figure 19:
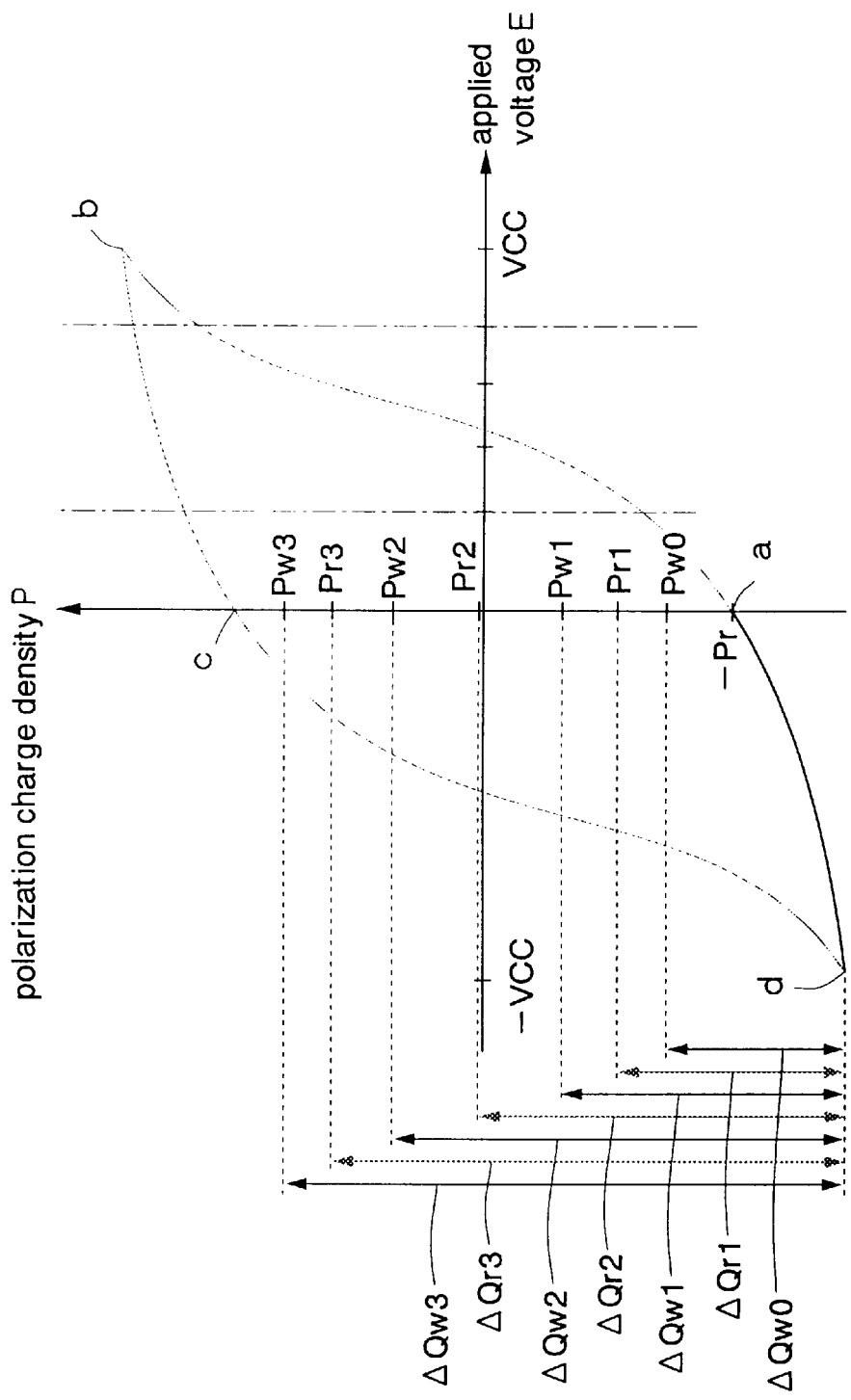
FIG. 19 shows an operation of reading data from the ferroelectric capacitor in the first embodiment.

On this occasion, as shown in FIG. 19, any one of electric charges ΔQw0, ΔQw1, ΔQw2, and ΔQw3 is generated corresponding to any one of the residual dielectric polarization values Pw0, Pw1, Pw2, and Pw3 of the ferroelectric capacitor 3 in the memory cell 1. The generated electric charge ΔQw0 (ΔQw1, ΔQw2, or ΔQw3) is distributed in a manner such that the voltage of the bit line BL and the voltage of the ferroelectric capacitor 3 are equalized. As a result, the voltage of the bit line BL increases in response to the residual dielectric polarization value Pw0, Pw1, Pw2 or Pw3.

Electric charges ΔQr1, ΔQr2, and ΔQr3 are generated corresponding to the residual dielectric polarization values Pr1, Pr2, and Pr3 of the ferroelectric capacitors 36 in the reference memory cells 35-1, 35-2, and 35-3 respectively. Each of the generated electric charges ΔQr1, ΔQr2, and ΔQr3 is distributed in a manner such that the voltages of the reference bit lines BLr1, BLr2, BLr3 become equal to the voltages of the ferroelectric capacitors 36 in the reference memory cells 35-1, 35-2, and 35-3 respectively. As a result, the voltages of the reference bit lines BLr1, BLr2, and BLr3 increase to predetermined values in accordance with the residual dielectric polarization values Pr1, Pr2 and Pr3 respectively.

The voltages of the bit line BL and the reference bit lines BLr1, BLr2, and BLr3 are then compared by the comparison unit 37.

For example, when a digital value "2" is stored, the residual dielectric polarization value is Pw2, and the electric charge ΔQw2 is generated in the ferroelectric capacitor 3 upon the read operation. Since ΔQr3 (BLr3)>ΔQw2 (BL)>ΔQr2 (BLr2), the voltage of the bit line BL is higher than the voltage of the reference bit line BLr2 and lower than that of the reference bit line BLr3. Therefore, the output from the comparators 37-1 and 37-2 goes high level while the output from the comparator 37-3 is at low level.

In other words, by 3 comparators 37-1, 37-2 and 37-3, the number of which (3 in this case) is smaller than the number of the input digital values (4 in this case) by 1, the voltage corresponding to any one of the electric charges ΔQW0, ΔQw1, ΔQw2, and ΔQw3 generated in the bit line BL and the voltage generated in each of the reference bit lines BLr1, BLr2, and BLr3 can be compared easily.

The comparators 37-1, 37-2, and 37-3 output the comparison result to the encoder 39. The encoder 39 causes the output data Dout1 and Dout2 to become high and low level respectively according to the truth table in Table 1. In other words, the operation of reading the written data "2" is completed.

By the reading of data, the polarization charges of the ferroelectric capacitors 3 and 36 change close to "a" via the vicinity of "d". The polarization charge values do not become exactly "d" and "a". Upon reading data, the voltages of the bit line BL and the reference bit lines BLr1, BLr2 and BLr3 increase to predetermined voltages, and thus the voltage (VBL−VPL) of the bit line BL and the voltage of the reference bit lines BLr1, BLr2 and BLr3 relative to the plate line PL and the reference plate line PLr respectively do not become −VCC exactly. Therefore, the polarization charge values do not become exactly "d" and "a".

As a result, the residual dielectric polarization values of the ferroelectric capacitors 3 and 36 approximately become −Pr, causing the written data to be destroyed. Therefore, a subsequent rewrite operation is necessary.

In order to cause the residual dielectric polarization values of the ferroelectric capacitors 3 and 36 to become −Pr exactly, initialization of the residual dielectric polarization of the memory cell 1 and the reference memory cells 35-1, 35-2, and 35-3 is performed before the rewrite operation.

The rewrite operation is performed by inputting the digital value restored by the encoder 39 to the DA converter 21. In other words, the select signal SEL is raised to high level first and the select switches 27a and 27b are switched. The DA enable signal DAE is then changed to become high, the word line WL high, and the plate line PL 0V, respectively. In this state, the DA converter 21 and the DA converters 31-1, 31-2, and 31-3 output a write analog voltage value W0, or W1, or W2, or W3 and reference write analog voltages Wr1, Wr2 and Wr3 respectively. In this manner, the rewrite operation is performed.

After the rewrite operation, the electric charges in the parasitic capacitors Cp of the memory cell 1 and the reference memory cells 35-1, 35-2, and 35-3 are discharged. The read operation is then completed.

Figure 20:
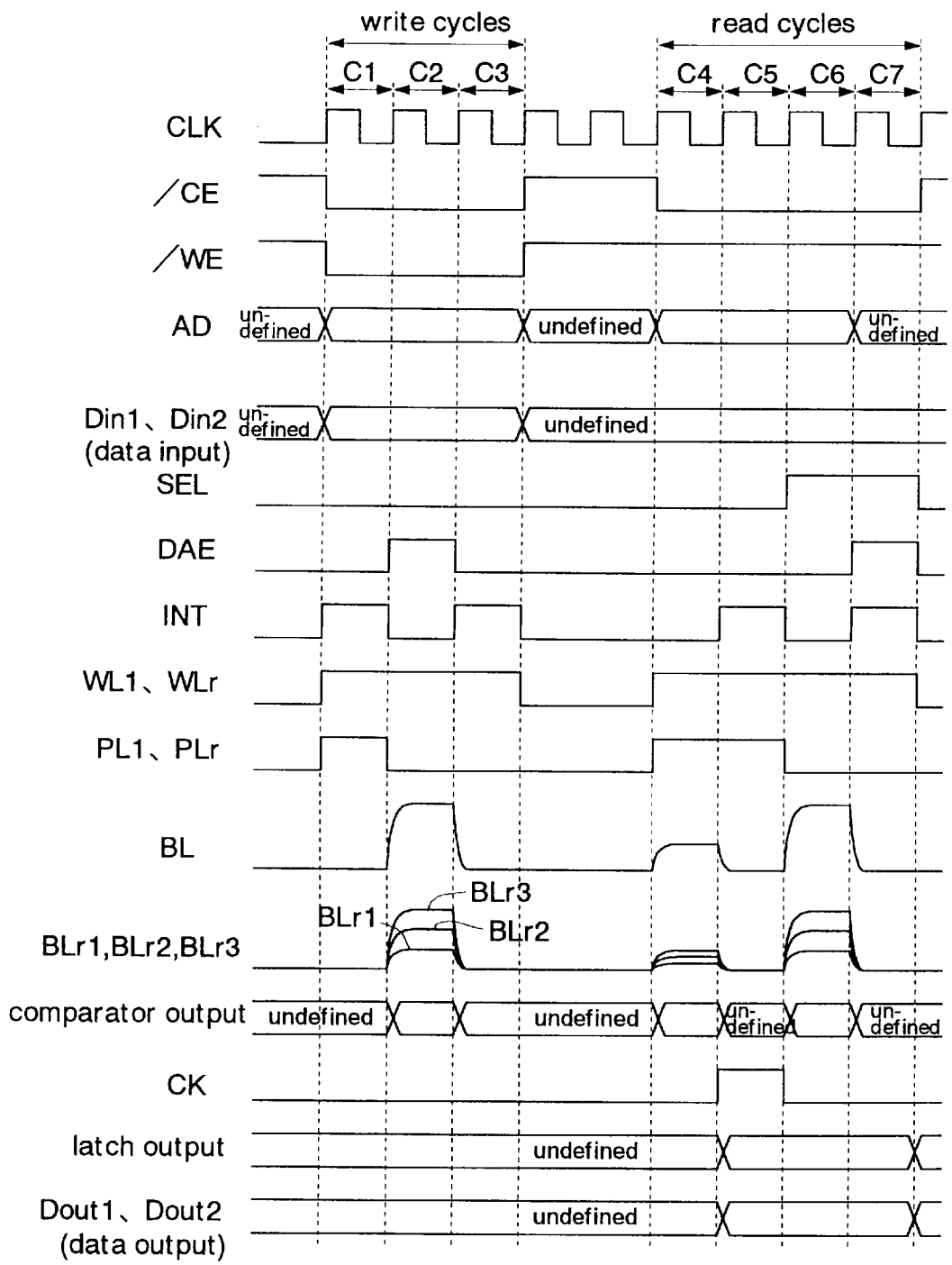
FIG. 20 is a timing chart showing the write and read operations in the first embodiment.

FIG. 20 shows a timing chart of the write operation and the read operation described in the above. In the write operation, in the first cycle C1 of the write cycle, initialization of the residual dielectric polarization of the ferroelectric capacitors 3 and 36 is performed. In the second cycle C2, data are written in the memory cell 1 and the predetermined values are written in the reference memory cells 35-1, 35-2, and 35-3. In the third cycle C3, the electric charges in the parasitic capacitors Cp are discharged, and the write operation is completed.

In the fourth cycle C4 in the read cycle, the written data are read from the memory cell 1 and the predetermined data are read from the reference memory cells 35-1, 35-2, and 35-3. In the fifth cycle C5, the residual dielectric polarization is initialized. In the sixth cycle C6, the digital value is rewritten in the memory cell 1, and the predetermined digital values are also rewritten in the reference memory cells 35-1, 35-2, and 35-3. The rewriting of the data in the memory cell 1 in this cycle is performed by using the digital value restored by the encoder 39. In the seventh cycle C7, the electric charges stored in the parasitic capacitors Cp are discharged and the rewrite operation is completed.

In the ferroelectric memory device in the above configuration, any one of the write analog voltages W0, W1, W2, and W3 corresponding to the 4 digital values converted by the DA converter 21 is applied to the ferroelectric capacitor 3 of the memory cell 1, and the residual dielectric polarization of any one of the values Pw0, Pw1, Pw2 and Pw3 occurs. Furthermore, the voltage of the bit line BL which changes in response to the electric charge $\Delta QW0$ (or $\Delta Qw1$, $\Delta Qw2$, $\Delta Qw3$) obtained by the residual dielectric polarization value Pw0 (or Pw1, Pw2, Pw3) is detected by the AD conversion circuit 23 and restored to the original digital value. Therefore, it becomes possible to store 4 digital values in the ferroelectric capacitor 3 and to read the stored data.

Moreover, the AD conversion circuit 23 comprises the reference memory cells 35-1, 35-2, and 35-3. Therefore, the original digital value can be restored with certainty by comparing the reference read analog voltages obtained from the residual dielectric polarization values Pr1, Pr2 and Pr3 and the read analog voltage obtained from any one of the residual dielectric polarization values Pw0, Pw1, Pw2, and Pw3 in the memory cell 1.

In the ferroelectric memory device of the present invention, the AD conversion circuit 23 comprises the DA converters 31-1, 31-2, and 31-3, the comparators 37-1, 37-2, and 37-3, and the encoder 39. Therefore, the DA converters 31-1, 31-2, and 31-3 can write in the reference memory cells 35-1, 35-2, and 35-3 the reference write analog voltages Wr1, Wr2, and Wr3 which are different from the write analog voltages W0, W1, W2, and W3. As a result, the comparators 37-1, 37-2, and 37-3 can compare the reference read analog voltages obtained from the reference memory cells 35-1, 35-2, and 35-3 with the read analog voltage obtained from the memory cell 1, and the encoder 39 can restore the original digital value.

Therefore, by using the 3 DA converters 31-1, 31-2, and 31-3 and the 3 reference memory cells 35-1, 35-2, and 35-3, the number of which (3 in this case) is smaller than the number of the input digital values (4 in this case) by 1, the residual dielectric polarization values Pr1, Pr2 and Pr3 which are intermediate values of the residual dielectric polarization values Pw0, Pw1, Pw2 and Pw3 can be obtained. Furthermore, by using the 3 comparators 37-1, 37-2 and 37-3 the number of which (3 in this case) is smaller than the number of the input digital values (4 in this case) by 1, the read analog voltage corresponding to the electric charge $\Delta Qw0$ (or $\Delta Qw1$, $\Delta Qw2$, $\Delta Qw3$) can be compared with the reference read analog voltages generated in the reference bit lines BLr1, BLr2 and BLr3.

Moreover, the reference write analog voltage values Wr1, Wr2, and Wr3 output from the DA converters 31-1, 31-2, and 31-3 are set to intermediate values of the write analog voltages W0, W1, W2 and W3 which can be written in the memory cell 1. Therefore, a difference between the reference read analog voltages and the read analog voltage can be large upon reading data, and the comparison of the reference read analog voltages and the read analog voltage can thus be performed with certainty.

The memory cell 1 has the same size and shape as the reference memory cells 35-1, 35-2, and 35-3. Therefore, the characteristic of the ferroelectric capacitor 3 in the memory cell 1 is the same as that of the ferroelectric capacitors 36 in the reference memory cells 35-1, 35-2, and 35-3. Consequently, upon writing data, any one of the write analog voltages W0, W1, W2, and W3 and predetermined residual dielectric polarization values corresponding to the reference write analog voltages Wr1, Wr2, and Wr3 can be set to the ferroelectric capacitors 3 and 36 of the memory cell 1 and the reference memory cells 35-1, 35-2, and 35-3 respectively. Upon reading data, the reference read analog voltages Wr1, Wr2 and Wr3 can be compared with great accuracy with the read analog voltage.

The load capacitances of the bit line BL and the reference bit lines BLr1, BLr2, and BLr3 are the same. Therefore, the read analog voltage and the reference read analog voltages which properly reflect the residual dielectric polarization values of the ferroelectric capacitors 3 and 36 can be obtained, and the comparison of the read analog voltage and the reference analog voltages can be performed with great accuracy.

The bit line BL and the reference bit lines BLr1, BLr2 and BLr3 are grounded (0V) via the NMOSs 4 and 25, and the voltages of these lines can be set to 0V by the initializing signal INT. Therefore, by causing the word line WL and the reference word line WLr to go high and by causing the plate line PL and reference plate line PLr to become VCC, the residual dielectric polarization values of the ferroelectric capacitors 3 and 36 can be initialized to a predetermined value (−Pr).

As a result, the residual dielectric polarization values of the ferroelectric capacitors 3 and 36 can always be set to the same value before the write operation and an effect of the initial or previous residual dielectric polarization is not observed.

The voltages of the bit line BL and the reference bit lines BLr1, BLr2 and BLr3 can be set to 0V by the initializing signal INT. Therefore, by causing the word line WL and the reference word line WLr to become high and the plate line PL and the reference plate line PLr to be at 0V, the electric charges in the parasitic capacitors Cp in the ferroelectric capacitors 3 and 36 can be discharged and proper data can be read without being affected by the electric charges in the parasitic capacitors Cp.

As a result, by discharging the electric charges in the parasitic capacitors Cp after a write operation or before a read operation, the electric charges stored in the parasitic capacitors Cp upon data writing can be discharged before a read operation. Therefore, only the electric charges corresponding to the residual dielectric polarization of the ferroelectric capacitors 3 and 36 can be obtained as the read analog voltage and the reference read analog voltages.

The lines of the output data Dout1 and Dout2 which show the digital value restored by the encoder 39 are connected to the input terminals 21b and 21a of the DA converter 21 via the select switches 27b and 27a. Therefore, rewriting data into the memory cell 1 can be performed with certainty by using the restored original digital value rather than by using the read analog voltage read from the memory cell 1.

Figure 21:
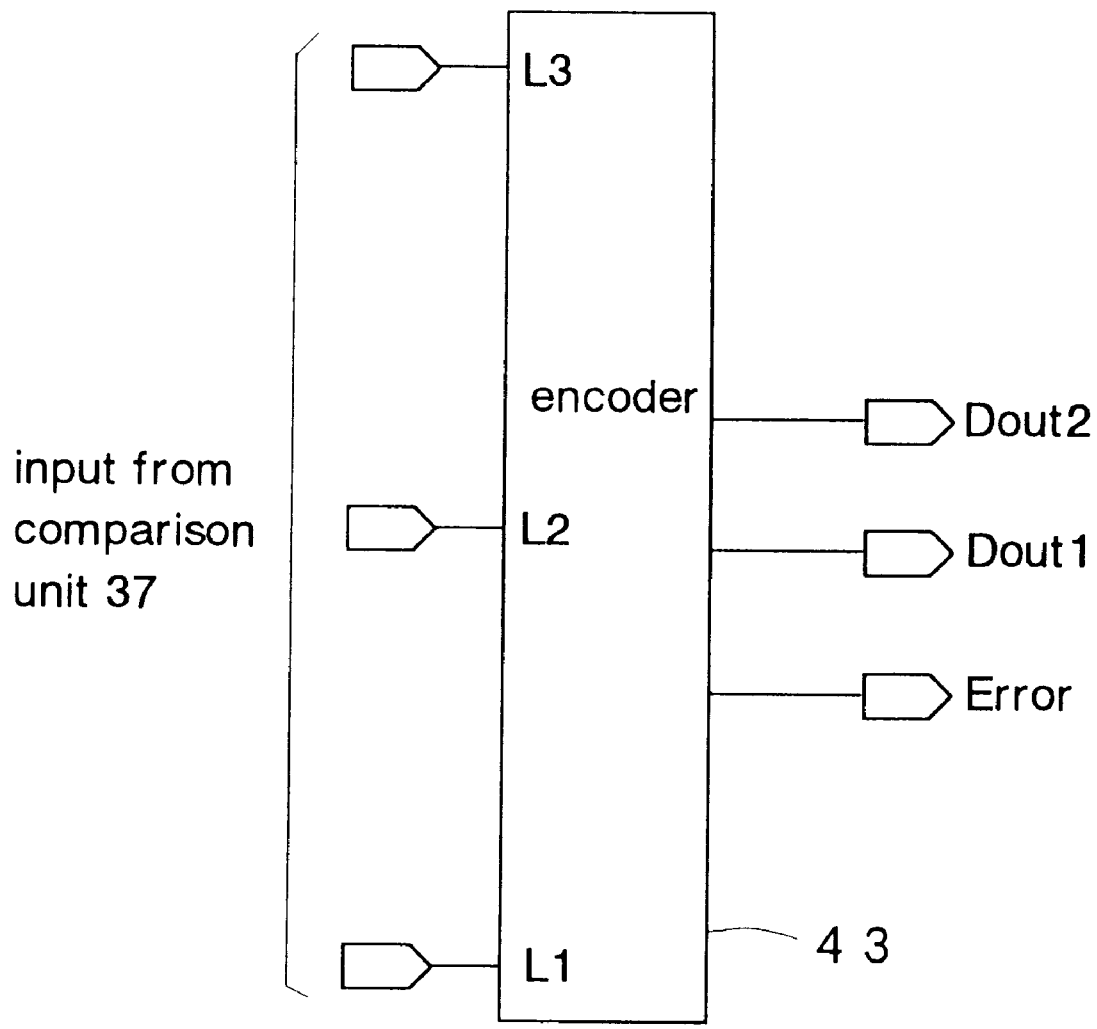
FIG. 21 is a block diagram showing an encoder in the second embodiment of the ferroelectric memory device of the present invention.

FIG. 21 shows an encoder 43 in the second embodiment of a ferroelectric memory device of the present invention.

The configurations other than the encoder 43 are the same as in the first embodiment.

In this embodiment, the encoder 43 uses an Error signal for outputting error information. The encoder 43 outputs the output data signals Dout1 and Dout2 and the Error signal in response to values of the input terminals L1, L2 and L3, according to a truth table shown in table 2.

TABLE 2

| input digital values | input | | | output | | |
|---|---|---|---|---|---|---|
| | L3 | L2 | L1 | Q2(Dout2) | Q1(Dout1) | Error |
| 3 | 1 | 1 | 1 | 1 | 1 | 0 |
| 2 | 0 | 1 | 1 | 1 | 0 | |
| 1 | 0 | 0 | 1 | 0 | 1 | |
| 0 | 0 | 0 | 0 | 0 | 0 | |
| — | the other combinations | | | undefined | undefined | 1 |

In other words, the encoder 43 causes the Error signal to go high level when the values of input terminals L1, L2 and L3 do not correspond to the input digital value. For example, when the values input to the input terminals L1, L2 and L3 do not correspond to the written digital value due to degradation or failure of the reference memory cells 35-1, 35-2, and 35-3, the Error signal becomes high level.

Therefore, by monitoring the Error signal by using another circuit, the error in the device can be detected.

In the first embodiment, the configuration for storing 4 values in the memory cell 1 by using 2-bit input data has been explained. However, the present invention is not limited to this embodiment. For example, a configuration for storing 8 values in the memory cell 1 by using 3-bit input data can be adopted as well. Alternatively, a configuration wherein 4 values each are stored in 2 memory cells is also possible.

In the above first embodiment, the example of discharging the electric charges in the parasitic capacitors Cp after the completion of a write operation has been explained. However, the present invention is not limited to such an embodiment. For example, the discharging may be performed upon the start of a read operation.

In the above first embodiment, the example of fabricating a memory chip has been explained. However, the present invention is not limited to such an embodiment. For example, the ferroelectric memory may be composed as a module in a system LSI.

What is claimed is:

1. A ferroelectric memory comprising:
    a memory cell including a ferroelectric capacitor;
    a DA converter for applying a write analog voltage corresponding to any one of 3 or more digital values to a electrode of the ferroelectric capacitor to cause residual dielectric polarization to occur in the capacitor; and
    an AD conversion circuit for restoring to the original digital value based on a read analog voltage obtained in response to the residual dielectric polarization of the capacitor.

2. The ferroelectric memory according to claim 1, wherein the AD conversion circuit comprises:
    a plurality of reference memory cells each of which includes a ferroelectric capacitor;
    a DA conversion unit for applying a reference write analog voltage different from the write analog voltage to an electrode of the capacitor in each of the reference memory cells, to cause a residual dielectric polarization to occur in the capacitor;
    a comparison unit for comparing a reference read analog voltage obtained in response to the residual dielectric polarization value with the read analog voltage; and
    a restore unit for restoring to the original digital value based on the comparison result by the comparison unit.

3. The ferroelectric memory according to claim 2, wherein
    the DA conversion unit sets each of the reference write analog voltages to an intermediate value between each of the write analog voltages.

4. The ferroelectric memory according to claim 2, wherein
    the memory cell and the reference memory cells are formed in the same size and shape.

5. The ferroelectric memory according to claim 2, wherein
    the DA converter is connected to the memory cell by a bit line and the DA conversion unit in the AD conversion circuit is connected to the reference memory cells by reference bit lines, having the same capacitance as that of the bit line.

6. The ferroelectric memory according to claim 2, wherein
    the restore unit outputs error information when the original digital value cannot be restored based on the comparison result by the comparison unit.

7. The ferroelectric memory according to claim 2, further comprising
    a polarization initializing circuit for setting the residual dielectric polarization value of the ferroelectric capacitor to a predetermined value.

8. The ferroelectric memory according to claim 7, wherein
    the polarization initializing circuit sets the residual dielectric polarization value before a write operation.

9. The ferroelectric memory according to claim 2, further comprising
    a discharging circuit for discharging a charge stored in a parasitic capacitor of the ferroelectric capacitor.

10. The ferroelectric memory according to claim 9, wherein
    the discharging circuit discharges the charge stored in the parasitic capacitor after a write operation or before a read operation.

11. The ferroelectric memory according to claim 1, wherein
    an operation of rewriting data in the memory cell is performed by inputting the restored original digital value to the DA converter.

* * * * *